United States Patent
Campbell et al.

(10) Patent No.: US 7,630,795 B2
(45) Date of Patent: Dec. 8, 2009

(54) METHOD AND AIR-COOLING UNIT WITH DYNAMIC AIRFLOW AND HEAT REMOVAL ADJUSTABILITY

(75) Inventors: Levi A. Campbell, Poughkeepsie, NY (US); Richard C. Chu, Hopewell Junction, NY (US); Michael J. Ellsworth, Jr., Lagrangeville, NY (US); Madhusudan K. Iyengar, Woodstock, NY (US); Roger R. Schmidt, Pougkeepsie, NY (US); Robert E. Simons, Pouhkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 19 days.

(21) Appl. No.: 12/031,961

(22) Filed: Feb. 15, 2008

(65) Prior Publication Data

US 2009/0207567 A1    Aug. 20, 2009

(51) Int. Cl.
*G05D 23/00* (2006.01)
*F25D 23/12* (2006.01)
*H05K 7/20* (2006.01)

(52) U.S. Cl. .................... 700/300; 700/277; 62/259.2; 361/701

(58) Field of Classification Search ............... 700/276, 700/277, 278, 282, 299, 300, 304; 62/186, 62/259.2; 361/701
See application file for complete search history.

(56) References Cited

U.S. PATENT DOCUMENTS

| | | | |
|---|---|---|---|
| 6,574,104 B2 | 6/2003 | Patel et al. | |
| 6,775,997 B2 | 8/2004 | Bash et al. | |
| 7,011,143 B2 | 3/2006 | Corrado et al. | |
| 7,373,268 B1 * | 5/2008 | Viredaz et al. | 702/130 |
| 2005/0023363 A1 | 2/2005 | Sharma et al. | |
| 2005/0235671 A1 | 10/2005 | Belady et al. | |
| 2006/0168975 A1 * | 8/2006 | Malone et al. | 62/180 |
| 2006/0232945 A1 | 10/2006 | Chu et al. | |
| 2007/0174024 A1 * | 7/2007 | Rasmussen et al. | 703/1 |

* cited by examiner

*Primary Examiner*—Ryan A Jarrett
(74) *Attorney, Agent, or Firm*—Geraldine Monteleone, Esq.; Kevin P. Radigan, Esq.; Heslin Rothenberg Farley & Mesiti, P.C.

(57) ABSTRACT

Method and air-cooling unit are provided for dynamically adjusting airflow rate through and heat removal rate of the air-cooling unit to facilitate cooling of one or more electronics racks of a data center. The air-cooling unit includes a housing, an air-moving device, and an air-to-liquid heat exchanger. The air-moving device moves air through the housing from the air inlet side to the air outlet side thereof, and the heat exchanger cools the air passing through the housing. A control unit controls the air-moving device and the flow of liquid coolant through the heat exchanger to automatically, dynamically adjust airflow rate and heat removal rate of the air-cooling unit to achieve a current airflow rate target and current heat removal rate target therefore. The current targets are based on airflow rate through and heat load generated by one or more associated electronics racks of the data center.

20 Claims, 14 Drawing Sheets

METHOD AND AIR-COOLING UNIT WITH DYNAMIC AIRFLOW AND HEAT REMOVAL ADJUSTABILITY

TECHNICAL FIELD

The present invention relates in general to methods and apparatuses for facilitating cooling of rack-mounted assemblages of individual electronics units, such as rack-mounted computer server units of a data center.

BACKGROUND OF THE INVENTION

The power dissipation of integrated circuit chips, and the modules containing the chips, continues to increase in order to achieve increases in processor performance. This trend poses a cooling challenge at both the module and system level. Increased airflow rates are needed to effectively cool high power modules and to limit the temperature of air that is exhausted into the computer center.

In many large server applications, processors along with their associated electronics (e.g., memory, disk drives, power supplies, etc.) are packaged in removable drawer configurations stacked within a rack or frame. In other cases, the electronics may be in fixed locations within the rack or frame. Typically, the components are cooled by air moving in parallel airflow paths, usually front-to-back, impelled by one or more air moving devices (e.g., fans or blowers). In some cases it may be possible to handle increased power dissipation within a single drawer by providing greater airflow, through the use of a more powerful air moving device or by increasing the rotational speed (i.e., RPMs) of an existing air moving device. However, this approach is becoming problematic at the rack level in the context of a computer installation (i.e., a data center).

The sensible heat load carried by the air exiting the rack is stressing the ability of the room air-conditioning to effectively handle the load. This is especially true for large installations with "server farms" or large banks of electronics racks close together. In such installations not only will the room air-conditioning be challenged, but the situation may also result in recirculation problems with some fraction of the "hot" air exiting one rack unit being drawn into the air inlet of the same rack or a nearby rack. This recirculating flow is often extremely complex in nature, and can lead to significantly higher rack inlet temperatures than expected. This increase in cooling air temperature may result in components exceeding their allowable operating temperature and in a reduction in long term reliability of the components.

SUMMARY OF THE INVENTION

The shortcomings of the prior art are overcome and additional advantages are provided, in one aspect, through the provision of a method of facilitating cooling of n electronics racks of a data center employing m air-cooling units within the data center, wherein $n \geq 1$ and $m \geq 1$. The method includes: determining airflow rate through and heat load rate of the n electronics racks; setting airflow rate through the m air-cooling units based on the determined airflow rate through the n electronics racks; determining heat removal rate of the m air-cooling units; and dynamically determining whether a difference between the heat removal rate of the m air-cooling units and the heat load rate of the n electronics racks is within a defined tolerance, and when not, automatically adjusting heat removal rate of the m air-cooling units to bring the difference within the defined tolerance, thereby facilitating cooling of the n electronics racks of the data center.

In another aspect, an air-cooling unit for a data center is provided. The air-cooling unit includes a housing, an air-moving device, an air-to-liquid heat exchanger and a control unit. The housing has an air inlet side and an air outlet side, and the air-moving device moves air through the housing from the air inlet side to the air outlet side thereof. The air-to-liquid heat exchanger is associated with the housing for cooling air passing through the housing from the air inlet side to the air outlet side thereof. The control unit dynamically controls the air-moving device and flow of liquid coolant through the air-to-liquid heat exchanger to automatically adjust airflow rate through and heat removal rate of the air-cooling unit to achieve a current airflow rate target and a current heat removal rate target therefore. The current airflow rate target and current heat removal rate target are based on current airflow through and current heat load generated by at least one associated electronics rack of the data center.

In a further aspect, a data center is provided. The data center includes n electronics racks, wherein $n \geq 1$, and m air-cooling units, wherein $m \geq 1$. Each electronics rack includes an air inlet side and an air outlet side. The air inlet and air outlet sides respectively enabling ingress and egress of air through the electronics rack. Each air-cooling unit includes: a housing having an air inlet side and an air outlet side; an air-moving device for moving air through the housing from the air inlet side to the air outlet side thereof; and an air-to-liquid heat exchanger associated with the housing for cooling air passing through the housing from the air inlet side to the air outlet side thereof. The data center further includes at least one control unit for dynamically controlling the air-moving device and flow of liquid coolant through the air-to-liquid heat exchanger of each air-cooling unit of the m air-cooling units to automatically adjust airflow rate through and heat removal rate of the m air-cooling units to achieve a current airflow rate target and a current heat removal rate target therefore. The current airflow rate target and the current heat removal rate target are based on a current airflow rate through and a current heat load generated by the n electronics racks of the data center.

Further, additional features and advantages are realized through the techniques of the present invention. Other embodiments and aspects of the invention are described in detail herein and are considered a part of the claimed invention.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

DETAILED DESCRIPTION OF THE INVENTION

Figure 1:
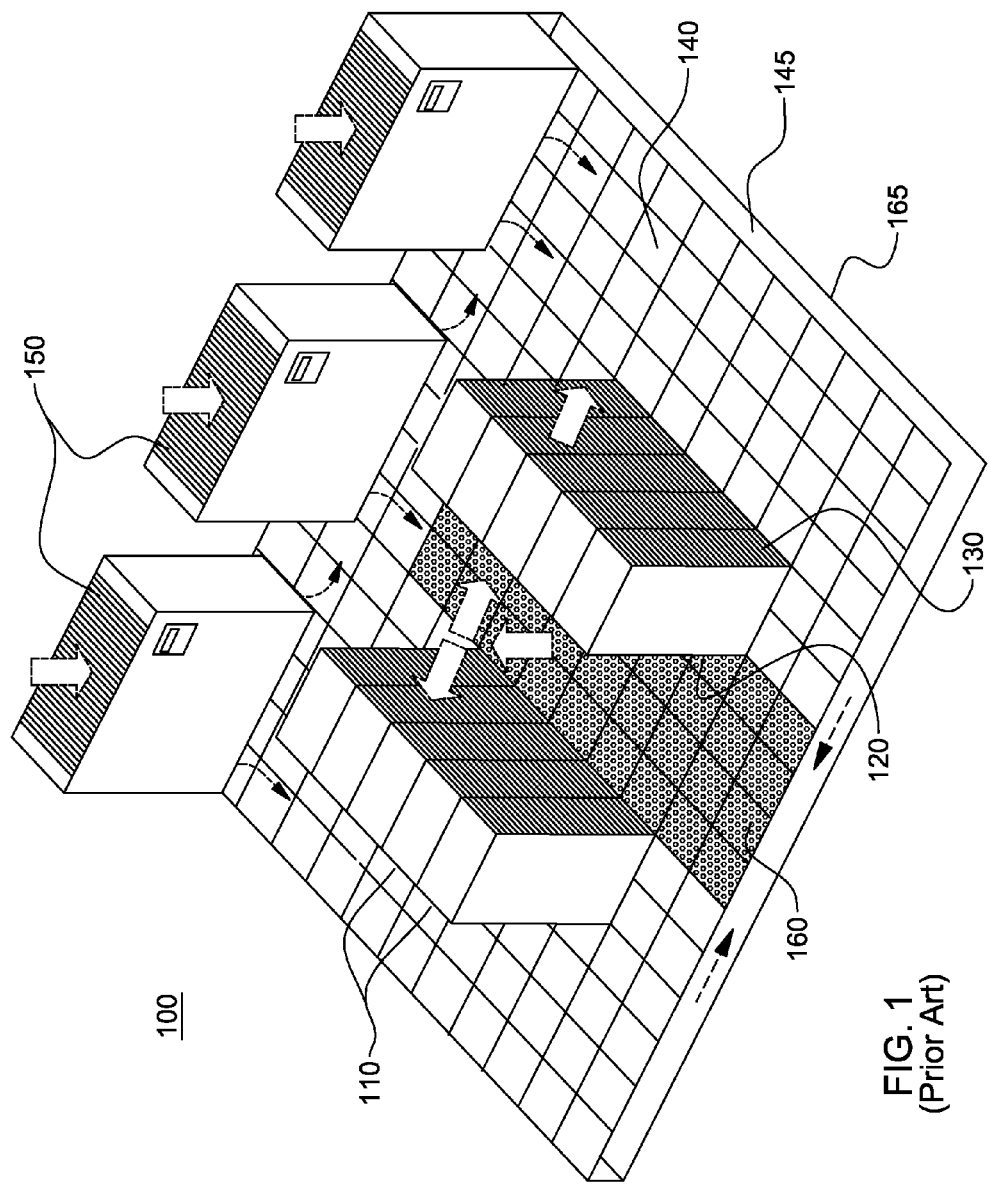
FIG. 1. depicts one embodiment of a conventional data center room layout including a plurality of electronics racks and a plurality of computer room air-conditioning units.

As used herein, the terms "electronics rack", "rack-mounted electronic equipment", and "rack unit" are used interchangeably, and unless otherwise specified include any housing, frame, rack, compartment, blade server system, etc., having one or more heat generating components of a computer system or electronics system, and may be, for example, a stand alone computer processor having high, mid or low end processing capability. In one embodiment, an electronics rack may comprise multiple electronics subsystems, each having one or more heat generating components disposed therein requiring cooling. "Electronics subsystem" refers to any sub-housing, blade, book, drawer, node, compartment, etc., having one or more heat generating electronic components disposed therein. Each electronics subsystem of an electronics rack may be movable or fixed relative to the electronics rack, with the electronics drawers of a multi-drawer rack unit and blades of a blade center system being two examples of subsystems of an electronics rack to be cooled.

As used herein, "air-to-liquid heat exchanger" means any heat exchange mechanism characterized as described herein through which liquid coolant can circulate; and includes, one or more discrete air-to-liquid heat exchangers coupled either in series or in parallel. An air-to-liquid heat exchanger may comprise, for example, one or more coolant flow paths, formed of thermally conductive tubing (such as copper or other tubing) in thermal communication with a plurality of air-cooled cooling fins. Size, configuration and construction of the air-to-liquid heat exchange assembly and/or air-to-liquid heat exchanger thereof can vary without departing from the scope of the invention disclosed herein. Further, "data center" refers to a computer installation containing one or more electronics racks to be cooled. As a specific example, a data center may include one or more rows of rack-mounted computing units, such as server units.

As used herein, air flows "across" the heat exchanger and "coolant" flows "through" the heat exchanger. Flowing across the heat exchanger refers to air passing across the outside of the conductive tubing forming the one or more coolant flow paths, while flowing through the heat exchanger refers to the coolant (e.g., liquid) passing through the heat exchanger's one or more coolant flow paths formed by the conductive tubing.

One example of liquid coolant employed in an air-to-liquid heat exchanger is water. However, the concepts disclosed herein are readily adapted to use with other types of liquid coolant. For example, one or more of the liquid coolants may comprise a brine, a fluorocarbon liquid, a liquid metal, or other similar coolant, or refrigerant, while still maintaining the advantages and unique features of the present invention.

Reference is made below to the drawings, which are not drawn to scale for reasons of understanding, wherein the same reference numbers used throughout different figures designate the same or similar components.

FIG. 1 depicts one embodiment of a raised floor, data center room layout 100 typical in the prior art. In this layout, multiple electronics racks 110 are disposed in one or more rows. A computer installation such as depicted in FIG. 1 may house several hundred, or even several thousand, microprocessors. In the arrangement of FIG. 1, chilled air enters the computer room via floor vents 160 from a supply air plenum 145 defined between the raised floor 140 and a base or sub-floor 165 of the room. Cooled air is taken in through air inlet sides 120 of the electronics racks 110 and expelled through air outlet sides 130 of the electronics racks. Each electronics rack 110 may have an air moving device (e.g., fan or blower) to provide forced inlet-to-outlet airflow to cool the electronics within the subsystem(s) of the rack. The supply air plenum 145 provides conditioned and cooled air to the air inlet sides of the electronics racks via perforated floor tiles 160 disposed in a "cold" aisle of the computer installation. The conditioned and cooled air is supplied to plenum 145 by one or more computer room air-conditioning (CRAC) units 150, also disposed within the computer installation 100. Room air is taken into each air-conditioning unit 150 near an upper portion thereof. This room air comprises in part exhausted air from the "hot" aisles of the computer installation defined, for example, by opposing air outlet sides of the electronics racks 110.

Limiting factors for cooling an air-cooled data center such as depicted in FIG. 1 are related to the maximum chilled airflow rate that can be supplied from a single perforated tile, the maximum cooling capabilities of each air-conditioning unit, and the hot air recirculation phenomenon that is common in these systems. Hot air recirculation occurs when the total airflow rate of supplied, chilled air in front of an electronics rack is less than the total rack airflow rate, leading to the hot exhaust air from one electronics rack being drawn into the intake of the same or another electronics rack, thus potentially resulting in unacceptably high rack inlet temperatures. This can impact reliability and performance of the electronics in the rack, and also lead to device failure in extreme cases.

Due to the two-dimensional nature of air delivery in the conventional raised floor data center layout (i.e., from the floor tile), and the three-dimensional nature of the electronics rack array (i.e., the three-dimensional nature of the rack air intake), there can be a large temperature difference at the intake vents of an electronics rack between the lower and upper portions thereof. By the time cool air entering from the floor tile reaches the upper portion of an electronics rack, it has typically mixed with the warmer room air. Since the design is driven by the highest rack intake temperature, the resulting operating point is inherently inefficient with respect to cooling energy consumption. The tortuous path for the air through the various expansions and contractions within the computer room air-conditioning unit, as well as outside of the unit (e.g., through the under-floor plenum, around cables, and other blockages, and through the perforated tiles, etc.) also contributes to the inefficient nature of the conventional chilled air delivery approach in a raised floor layout. In addition, there are numerous leakage paths for the air since the under-floor plenum is typically very porous. The seams around the tiles are rarely tight, cable openings at the back of the electronics racks bleed air into the hot air aisle, and the under-floor plenum itself is often fluidically coupled to other plenums and rooms. To counter these issues, or to take into account future expansion plans, many data centers adopt a brute force approach of providing two or three times the actual cooling capacity otherwise required to cool the electronics racks within the data center.

Thus, there are numerous drawbacks to conventional raised floor air-cooling of data centers, which are addressed by the concepts described hereinbelow. These drawbacks include:

A higher energy consumption due to computer room air-conditioner energy inefficiencies and impedances in the air delivery and exhaust flow paths.

A low facility coolant set point which drives significant compressor work in the refrigeration plant.

A relatively high coolant flow rate to computer room air-conditioning units, which requires high pumping power by the building chilled coolant pumps.

A higher total cost of ownership for the reasons identified above.

Higher acoustic noise in the data center room, for example, due to the relatively high pressure operating point of the air-moving devices of the computer room air-conditioning units.

High temperature gradients in front of an electronics rack due to complex hot air recirculation patterns, thus driving the design to accommodate the highest temperature, resulting in inefficient over-cooling in the lower portions of the electronics rack.

High temperature gradients which result in data center planners adding more CRAC unit capacity to counter the inefficient method of air delivery.

Generally stated, disclosed hereinbelow are a method and air-cooling unit for facilitating cooling of one or more electronics racks of a data center. In one embodiment, the air-cooling unit includes a housing having an air inlet side and an air outlet side, an air-moving device for moving air through the housing from the air inlet side to the air outlet side thereof, an air-to-liquid heat exchanger associated with the housing for cooling air passing through the housing, and a control unit for dynamically controlling the air-moving device and flow of liquid coolant through the air-to-liquid heat exchanger to automatically adjust airflow rate and heat removal rate of the air-cooling unit to achieve a current airflow rate target and a current heat removal rate target therefore. The current airflow rate target and current heat removal rate target are dynamically determined based on current airflow through and current heat load generated by one or more associated electronics racks within the data center.

Figure 2:
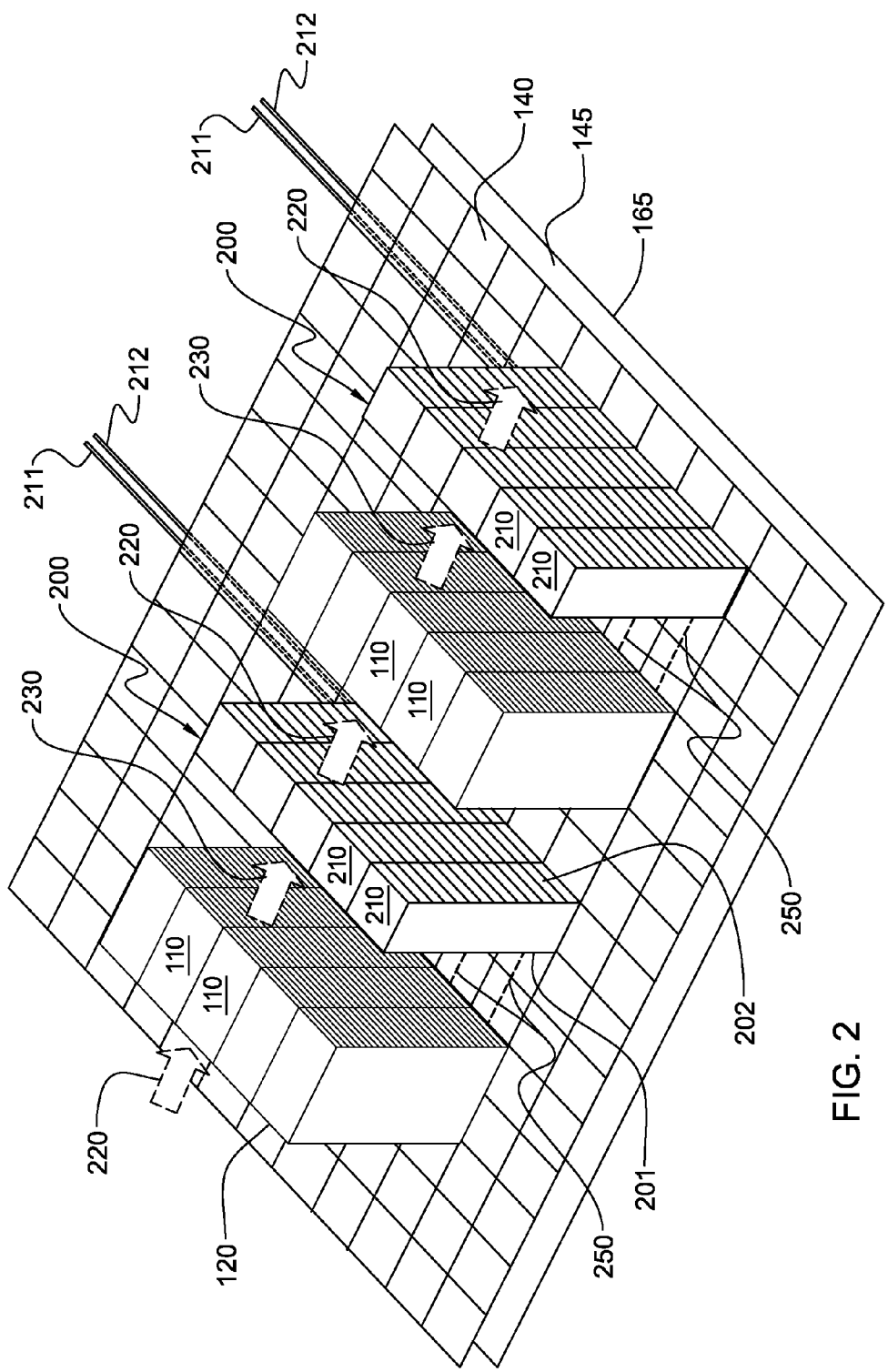
FIG. 2 depicts one embodiment of a data center room layout comprising a plurality of electronics racks and a plurality of air-cooling units, in accordance with an aspect of the present invention.

FIG. 2 illustrates one embodiment of a raised floor data center layout, in accordance with an aspect of the present invention. Multiple rows 200 of air-cooling units 210 are provided at the air outlet sides of the rows of electronics racks 110. Three-dimensional cooling of air is facilitated by sizing air-cooling units 210 to be similar in height and width to electronics racks 110. In the illustrated embodiment, air-cooling units 210 supply 100% of the chilled air 220 to the air inlet sides 120 of electronics racks 110 by cooling the hot exhaust air 230 from the air outlet sides 130 of electronics rack 110, thereby eliminating the undesirable hot air recirculation patterns typical with a data center layout such as depicted in FIG. 1. This invention also results in a lower airflow impedance and a lower pressure drop, which in turn yields a higher energy efficiency. As described further below, each air-cooling unit 210 includes at least one air-to-liquid heat exchanger which exhausts heat from air 230 to coolant flowing through the heat exchangers provided, for example, via a coolant supply line 211 and a coolant return line 212. In one embodiment, facility coolant supply and return lines 211, 212 are disposed in the under-floor plenum 145 between raised floor 140 and sub-floor 165. Additionally, each air-cooling unit 210 includes an air inlet side 201 and an air outlet side 202. The air inlet sides 201 of air-cooling units 210 are disposed in spaced, opposing relation to the air outlet sides 130 of electronics racks 110. As one detailed example, air-cooling units 210 may be spaced three feet or less from the air outlet sides of electronics rack 110 to facilitate drawing of exhausted hot air 230 into the air-cooling units 210.

In the embodiment depicted in FIG. 2, there is assumed to be a 1:1 correlation between electronics racks 110 and air-cooling units 210. Thus, each air-cooling unit 210 automatically adjusts its airflow rate through and heat removal rate to dynamically relate to the airflow rate through and heat removal rate of a respective electronics rack. Data cables 250 are provided, coupling each electronics rack 110 to its respective air-cooling unit 210 for use by a control unit thereof in automatically setting the airflow rate through the air-cooling unit and heat removal rate of the air-cooling unit, as explained further below.

Figure 3:
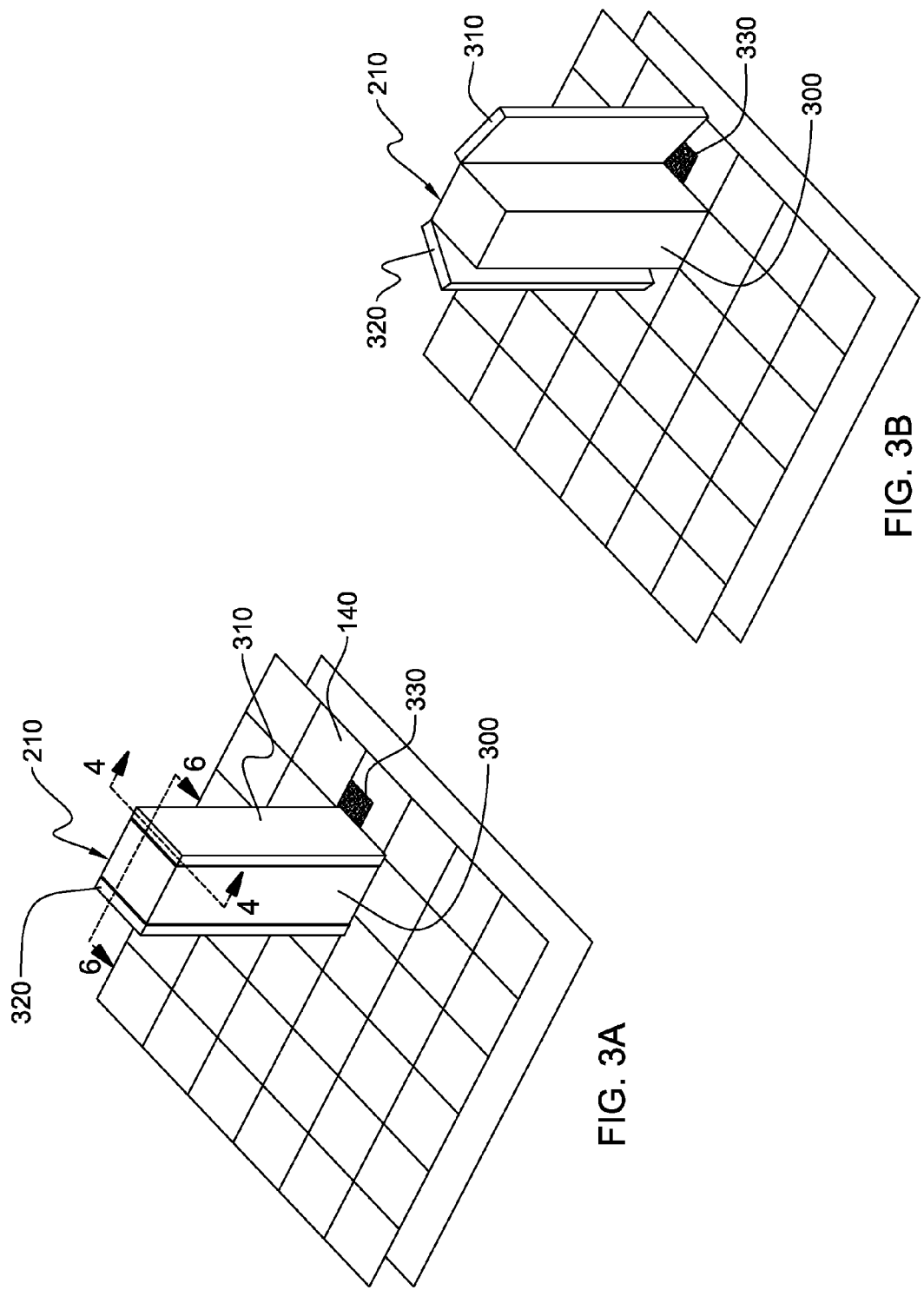
FIG. 3A depicts one embodiment of one air-cooling unit of the plurality of air-cooling units of FIG. 2, in accordance with an aspect of the present invention.
FIG. 3B depicts the air-cooling unit of FIG. 3A, with the air inlet side and air outlet side doors pivoted open, for example, to allow access to the housing for servicing of one or more components of the air-cooling unit, in accordance with an aspect of the present invention.

FIGS. 3A-6 depict one embodiment of air-cooling unit 210. As illustrated in FIGS. 3A & 3B, air-cooling unit 210 includes a housing 300 having an air inlet side and an air outlet side with an air inlet door 310 hingedly coupled to the air inlet side of the housing, and an air outlet door 320 hingedly coupled to the air outlet side of housing 300. Hingedly coupling air inlet door 310 and air outlet door 320 to housing 300 facilitates access to one or more components (described below) within housing 300, as well as access to components within air inlet door 310 and air outlet door 320. A floor tile cutout 330 may be provided in raised floor to allow connection of liquid coolant supply and return hoses to respective inlet and outlet coolant plenums of an air-to-liquid heat exchanger disposed, for example, in air inlet door 310.

Figure 4:
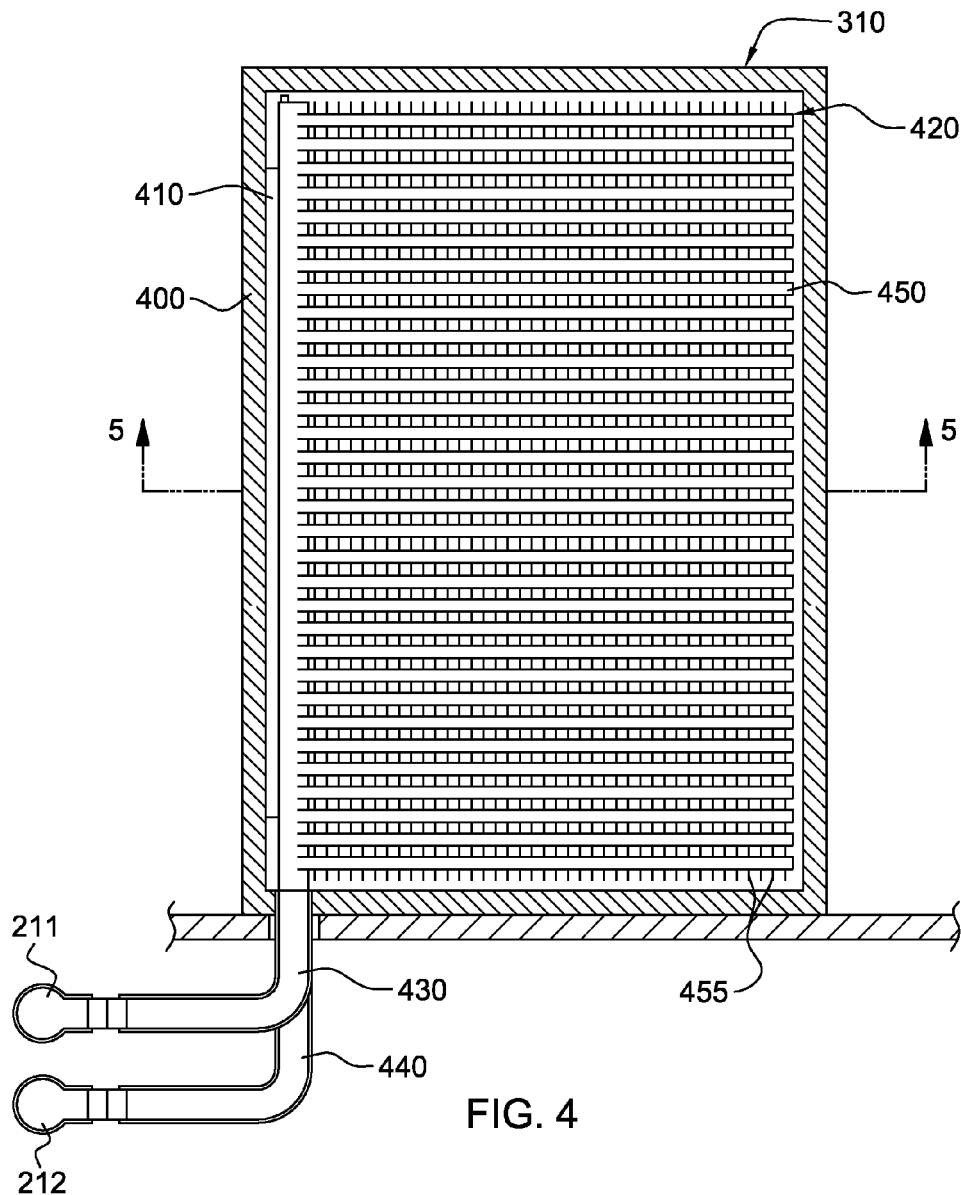
FIG. 4 is a cross-sectional elevational view of the air-cooling unit of FIG. 3A, taken along line 4-4, in accordance with an aspect of the present invention.
Figure 5:
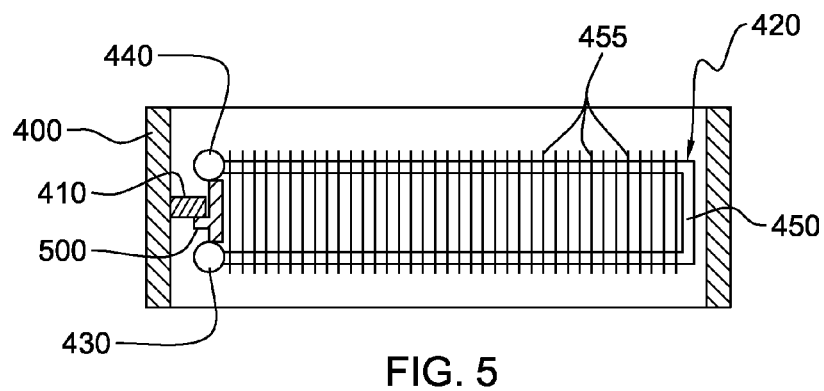
FIG. 5 is a cross-sectional plan view of the air inlet side door of FIGS. 3A & 4, taken along line 5-5 of FIG. 4, in accordance with an aspect of the present invention.

FIGS. 4 & 5 depict one embodiment of air inlet door 310 supporting an air-to-liquid heat exchanger 420, having coolant inlet and outlet plenums 430, 440. Referring to both figures collectively, door frame 400 supports a rigid flap 410 which attaches, for example, by brazing or soldering, to a plate 500 secured between coolant inlet plenum 430 and coolant outlet plenum 440. Coolant inlet plenum 430 is coupled to coolant supply line 211, and coolant outlet plenum 440 is coupled to coolant return line 212. The air-to-liquid heat exchanger includes a plurality of horizontally-oriented heat exchange tube sections 450. These heat exchange tube sections 450 each comprise a coolant channel having an inlet and an outlet, with each coolant channel inlet being coupled to the coolant inlet plenum 430, and each coolant channel outlet being coupled to coolant outlet plenum 440. A plurality of fins 455 are attached to horizontally-oriented heat exchange tube sections 450 for facilitating transfer of heat from air passing across the air-to-liquid heat exchanger to coolant flowing through the heat exchange tube sections. In one embodiment, the plurality of fins are vertically-oriented, rectangular fins attached to the horizontally-oriented heat exchange tube sections.

Figure 6:
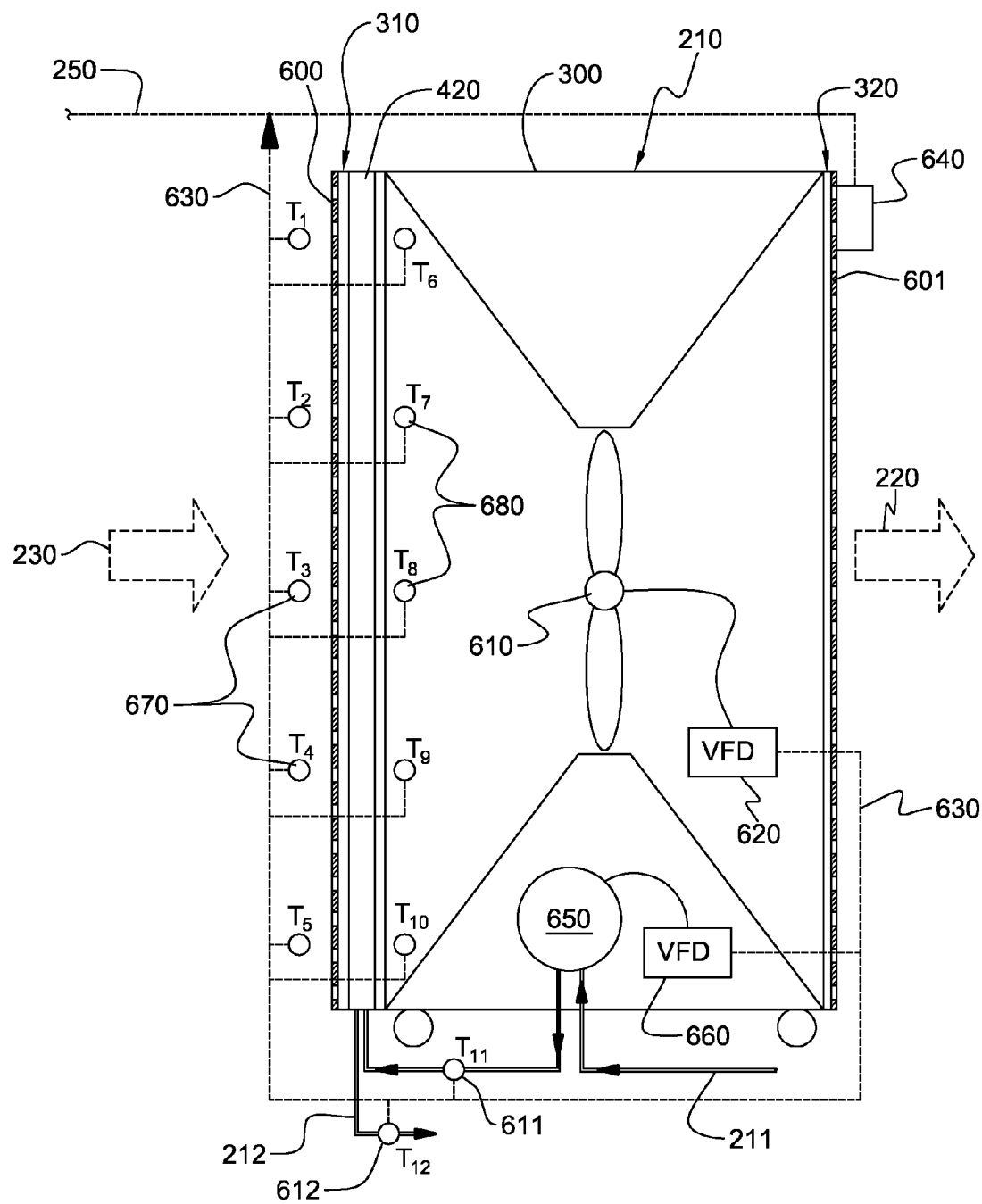
FIG. 6 is a cross-sectional elevational view of the air-cooling unit of FIG. 3A, taken along line 6-6, in accordance with an aspect of the present invention.

FIG. 6 is a side elevational view of air-cooling unit 210 taken along line 6-6 in FIG. 3A. As illustrated, air inlet door 310 includes air-to-liquid heat exchanger 420 and a perforated air inlet cover 600, and air outlet door 320 includes a perforated air outlet cover 601. Air inlet cover 600 and air outlet cover 601 facilitate ingress and egress of air through housing 300. Hot exhaust air 230 from one or more associated electronics racks is drawn into air cooling unit 210 via one or more air-moving devices 610. As the air passes across air-to-liquid heat exchanger 420 the air is cooled, and ultimately expelled as chilled air 220. As explained further below, the single, centrally depicted air-moving device 610 is one example only a device for moving air through air-cooling unit 210. This air-moving device 610 may comprise, for example, a fan, and is electronically controlled via a variable frequency drive 620. Variable frequency drive 620 is coupled via one or more data cables 630 to a control unit 640. Control unit 640 includes processing to dynamically adjust airflow rate through air-cooling unit 210, as explained below.

In the illustrated embodiment, liquid coolant is pumped via an adjustable pump 650 from coolant supply line 211 to air-to-liquid heat exchanger 420, and heated coolant is exhausted via coolant return line 212. Pump 650 allows adjustment of coolant flow rate through the air-to-liquid heat exchanger, and also reduces the burden on the coolant supply and return loop comprising coolant supply line 211 and coolant return line 212. In one embodiment, pump 650 is electronically coupled to a variable frequency drive 660, which is also coupled to control unit 640 via one or more data cables 630. In other embodiments, the adjustment of the coolant flow rate through the air-to-liquid heat exchanger may be achieved through some combination of the following elements: a pump, a two-way proportional control valve, a three-way proportional control valve with air-to-liquid heat exchanger flow bypass, and a shut-off valve. In addition to controlling airflow rate through the air-cooling unit, control unit 640 further includes processing for controlling heat removal rate of the air-cooling unit by controlling the flow of liquid coolant through air-to-liquid heat exchanger 420 via adjustable pump 650.

Control unit 640 implements a control process which provides dynamic, automatic adjustment of the airflow rate through and heat removal rate of the air-cooling unit. This control process employs, in one embodiment, the current airflow rate and current heat load generated by one or more associated electronics racks of the data center. The one or more associated electronics racks provide data via one or more data cables 250 to control unit 640. Additionally, the control process employs an averaged air inlet temperature value obtained via multiple inlet air temperature sensors 670 $T_1 \ldots T_5$ disposed at the air inlet side of the heat exchanger, and an averaged air outlet temperature obtained, for example, via multiple air outlet temperature sensors 680 $T_6 \ldots T_{10}$ disposed at the air outlet side of the heat exchanger. Appropriate data cabling 630 couples these sensors back to control unit 640. Additionally, a liquid coolant inlet temperature sensor $T_{11}$ 611 and liquid coolant outlet temperature sensor $T_{12}$ 612 respectively provide inlet temperature and outlet temperature of liquid coolant flowing into and from the heat exchanger. These values are also fed back to control unit 640 for use in the control process described below. If desired, the air-cooling unit can be disposed on castors to facilitate movement of the unit within the data center.

Figure 7A:
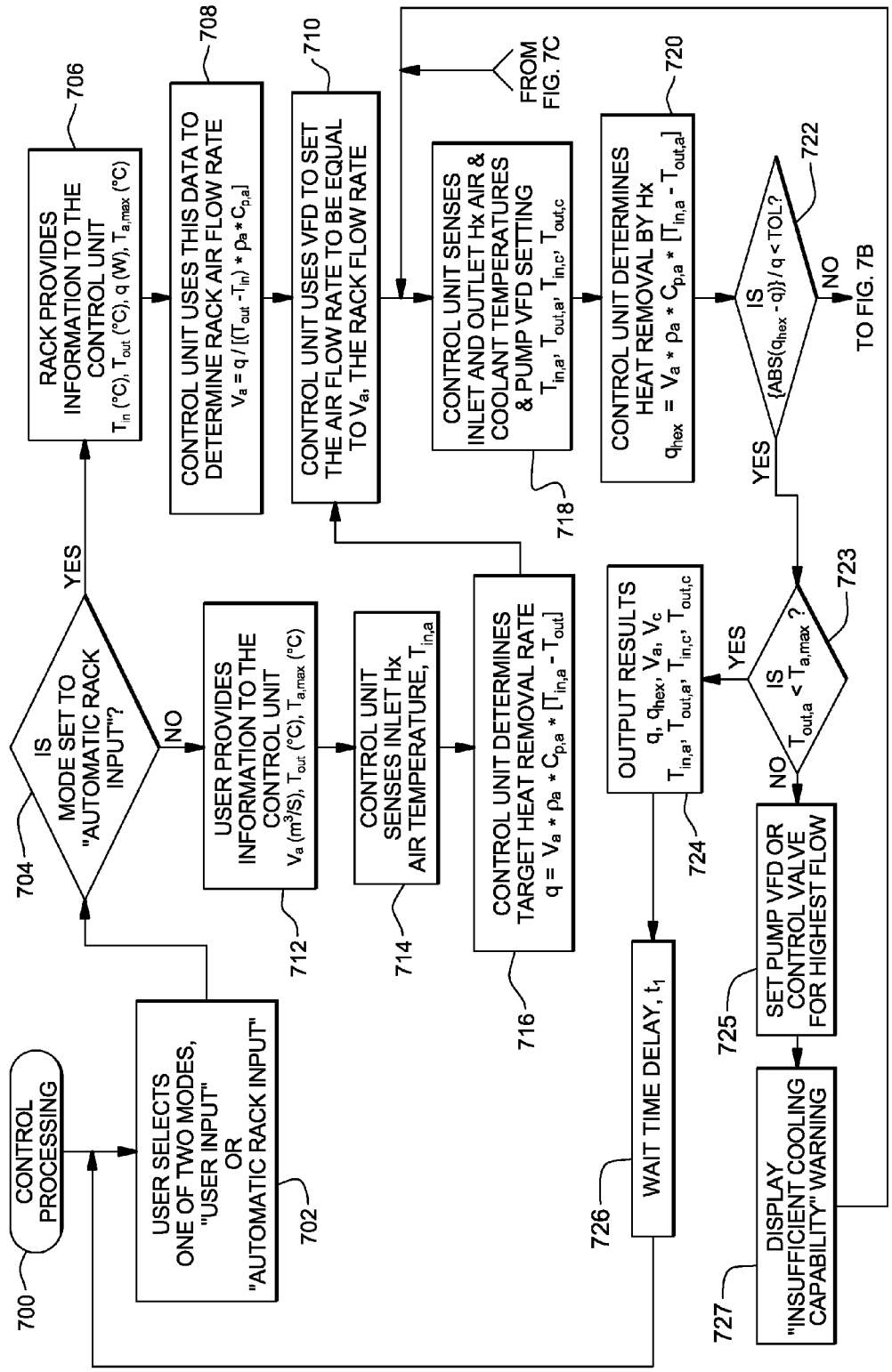
FIGS. 7A-7C depict a flowchart of one embodiment of processing for automatically adjusting heat removal rate of one or more air-cooling units to facilitate cooling of one or more associated electronics racks of a data center, in accordance with an aspect of the present invention.
Figure 7B:
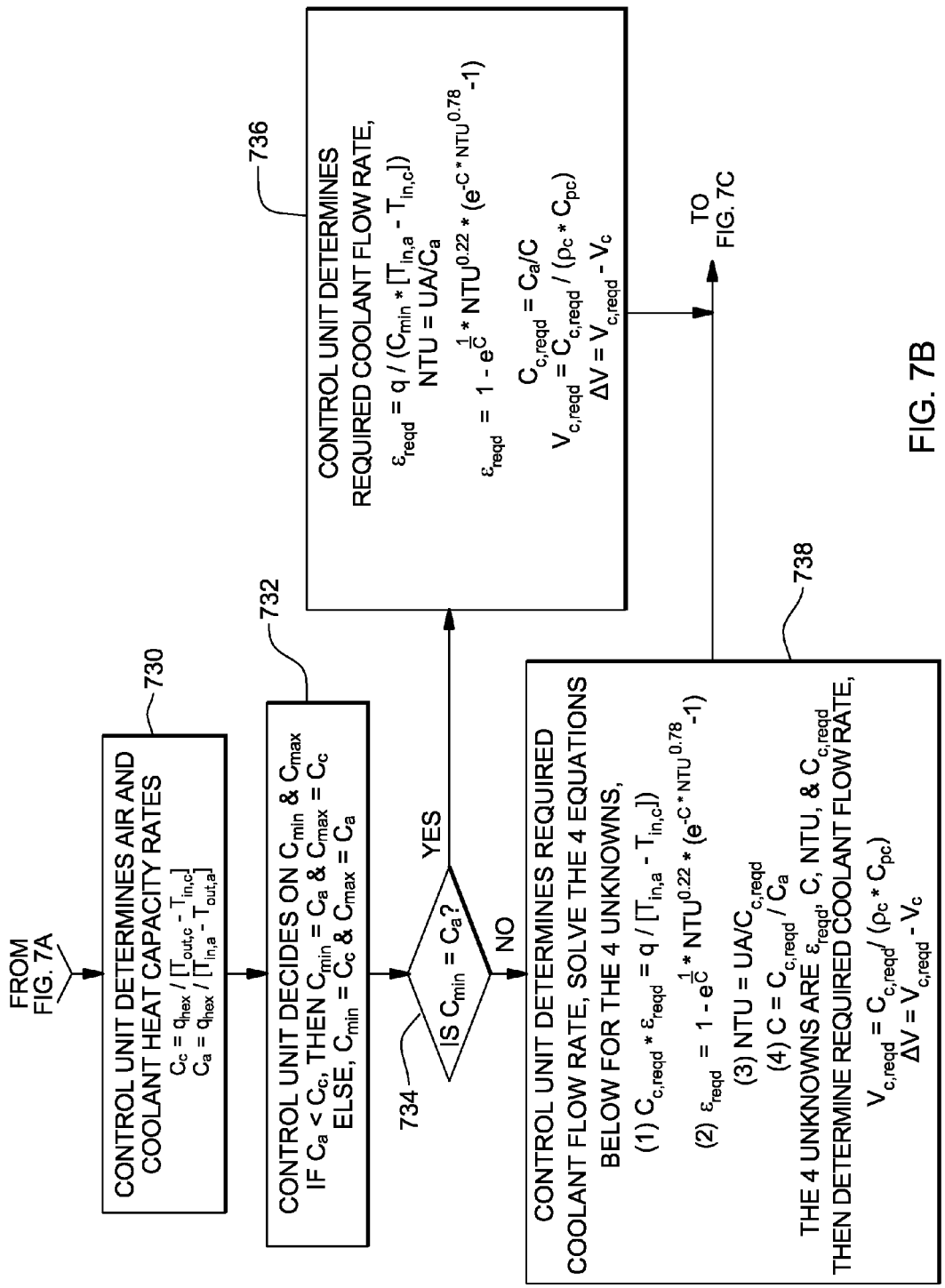
Figure 7C:
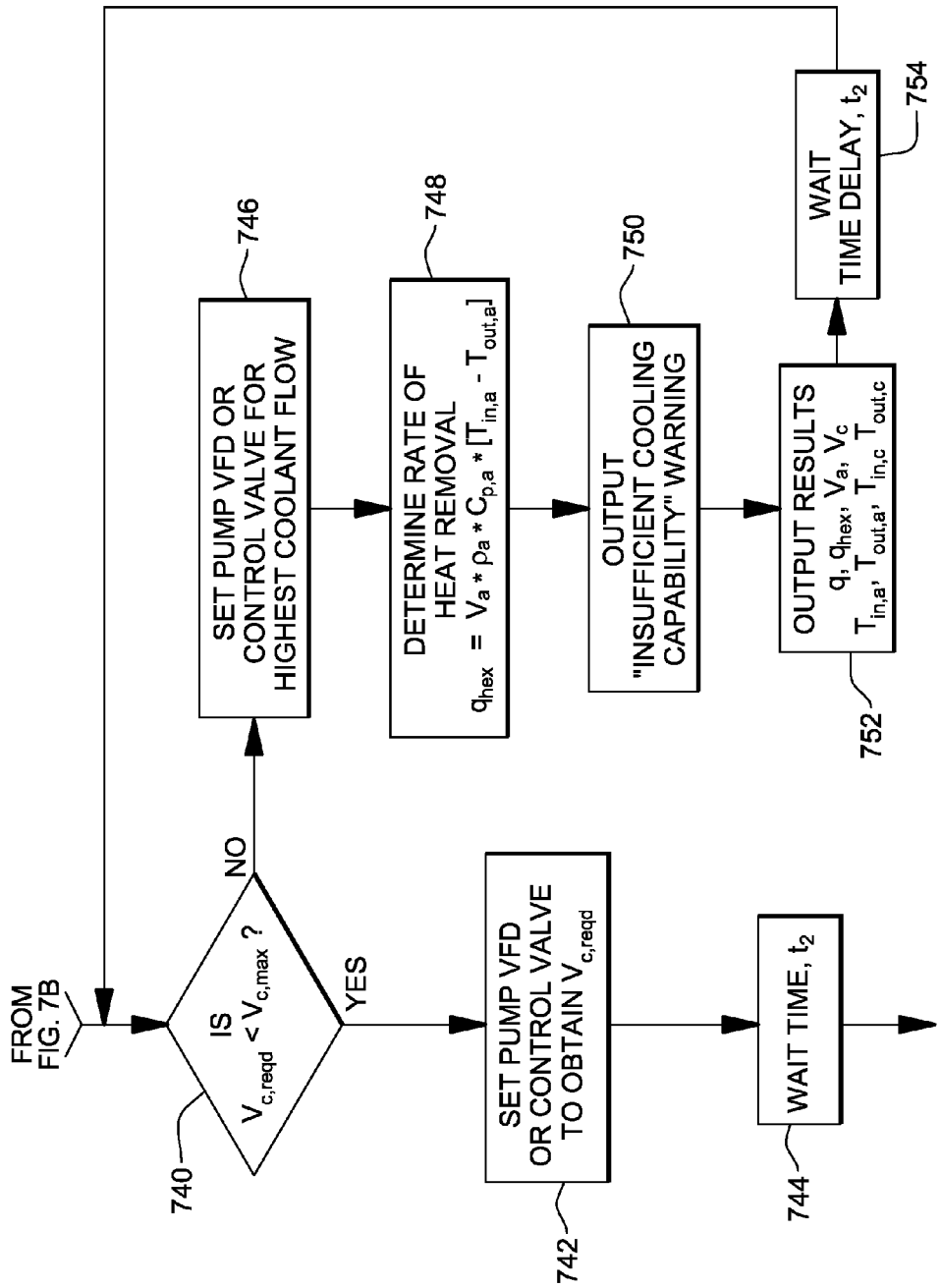

FIGS. 7A-7C depict one embodiment of a control process implemented by a control unit disposed, for example, on an air-cooling unit. Alternatively, the control unit could comprise a centrally located control unit within the data center which dynamically adjusts airflow and heat removal rate of one or more air-cooling units within the data center, as described herein.

Control processing 700 begins with a user selecting one of two modes, i.e., a "user input" or "automatic rack input" mode 702. In the user input mode, the user provides certain information to the control unit which then automatically determines the desired airflow rate and heat removal rate of the air-cooling unit. This mode may be advantageous where, for example, there is other than a one-to-one correlation between the number of electronics racks and the number of air-cooling units within the data center.

Processing determines whether the mode is set to automatic rack input 704. If "yes", then one or more associated electronics racks provides information to the control unit of the air-cooling unit 706. This information includes the air inlet temperature to the associated electronics rack ($T_{in,a}$), the outlet air temperature from the associated electronics rack ($T_{out,a}$), the heat load of the associated electronics rack (q), and the maximum allowable rack inlet air temperature, $T_{a,max}$. The control unit then uses this data to determine the rack volumetric airflow rate ($V_a$) 708. The rack volumetric airflow rate can be determined by:

$$V_a = q/[(T_{out}-T_{in}) \times \rho_a \times C_{p,a}] \quad (1)$$

wherein the variables employed in Equation (1) are defined in Table 1 below.

If the user has selected user input mode, then the user provides information to the control unit of the air-cooling unit 712. This information includes the rack volumetric airflow rate ($V_a$), the outlet air temperature from the associated electronics rack ($T_{out}$), and the maximum allowable rack inlet air temperature ($T_{a,max}$). The control unit then senses the air inlet temperature to the associated electronics rack ($T_{in,a}$).

The control unit uses the variable frequency drive 620 (FIG. 6) to set the airflow rate through the air-cooling unit 210. In one embodiment, this airflow rate can be set to be equal to the airflow rate through the one or more associated electronics racks 710. The control unit then senses inlet and outlet heat exchanger air and coolant temperatures ($T_{in,a}$, $T_{out,a}$, $T_{in,a}$, $T_{out,c}$), and the coolant pump variable frequency drive setting 718. These parameters are employed in determining the heat removal rate of the air-to-liquid heat exchanger ($q_{hex}$) of the air-cooling unit 720.

Control process next determines whether the absolute value of the normalized difference between the heat removal rate of the heat exchanger of the air-cooling unit ($q_{hex}$) and the heat load generated by the associated electronics rack (q) is less than a defined tolerance (Tol) value 722. By way of example, the tolerance (Tol) value might be in the range of 0.01-0.05. Assuming that the heat removal rate of the air-cooling unit is within the defined tolerance of the heat load generated by the associated electronics rack, then the control unit determines whether the outlet air temperature from the associated electronics rack ($T_{out}$) is less than the maximum allowable rack inlet air temperature ($T_{a,max}$). If "no", then the control processing sets the variable frequency drive of the pump or the associated control valve for a highest coolant flow rate 725 and displays an "insufficient cooling capability" warning 727, before returning to again sense the inlet and outlet heat exchanger air and coolant temperatures, and the pump variable frequency drive setting 718. Otherwise, the control unit outputs the results of the control process 724. As used herein, "output" refers to displaying, saving, printing or otherwise providing the determined results to or for use of, for example, a site engineer of the data center. This output can include the heat load of the associated electronics rack (q), the heat removal rate of the heat exchanger of the air-cooling unit ($q_{hex}$), the volumetric airflow rate through the associated electronics rack ($V_a$), the volumetric flow rate of coolant through the air-cooling unit's heat exchanger ($V_c$), the inlet air temperature to the air-cooling unit's heat exchanger ($T_{in,a}$), the outlet temperature from the air-cooling unit's heat exchanger ($T_{out,a}$), the inlet coolant temperature to the air-cooling unit's heat exchanger ($T_{in,c}$), and the outlet coolant temperature from the air-cooling unit's heat exchanger ($T_{out,c}$). Processing then waits a defined time interval $t_1$ before automatically returning to repeat the control process 726.

If the normalized difference between the heat removal rate of the air-cooling unit ($q_{hex}$) and the heat load generated by the associated electronics rack (q) is not less than the predefined acceptable tolerance (Tol), then processing continues in FIG. 7B to determine the air heat capacity rate ($C_a$) and the coolant heat capacity rate ($C_c$) 730. The control unit decides which heat capacity rate is larger, that is, whether the heat capacity rate of the air passing across the heat exchanger is larger, or the heat capacity rate of coolant passing through the heat exchanger is larger 732. Processing inquires whether the heat capacity rate of air passing across the heat exchanger is lower than the heat capacity rate of coolant passing through the heat exchanger 734, and if so, determines the required coolant flow rate employing Equations (2)-(6) below.

$$\varepsilon_{reqd} = q / (C_{min} \times [T_{in,a} - T_{in,c}]) \quad (2)$$

$$NTU = UA / C_a \quad (3)$$

$$\varepsilon_{reqd} = 1 - e^{\frac{1}{C} \cdot NTU^{0.22} \cdot \left(e^{-C \cdot NTU^{0.78}} - 1\right)} \quad (4)$$

$$C_{c,reqd} = C_a / C \quad (5)$$

$$V_{c,reqd} = C_{c,reqd} / (\rho_c \times C_{pc}) \quad (6)$$

Where the variables of Equations (2)-(6) are defined in Table 1 below.

If the heat capacity rate of coolant passing through the heat exchanger is lower than the heat capacity rate of the passing across the heat exchanger, then processing determines a required coolant volumetric flow rate by solving Equations (7)-(10) below for the four unknowns.

$$C_{c,reqd} \times \varepsilon_{reqd} = q / [T_{in,a} - T_{in,c}] \quad (7)$$

$$\varepsilon_{reqd} = 1 - e^{\frac{1}{C} \cdot NTU^{0.22} \cdot \left(e^{-C \cdot NTU^{0.78}} - 1\right)} \quad (8)$$

$$NTU = UA / C_{c,reqd} \quad (9)$$

$$C = C_{c,reqd} / C_a \quad (10)$$

Where the four unknowns are $\varepsilon_{reqd}$, C, NTU, & $C_{c,reqd}$. The required coolant volumetric flow rate can then be determined from Equation (11) below.

$$V_{c,reqd} = C_{c,reqd} / (\rho_c \times C_{pc}) \quad (11)$$

Referring to FIG. 7C, once the required coolant flow rate through the air-cooling unit is determined, then processing determines whether the required coolant flow rate ($V_{c,reqd}$) is less than the maximum coolant flow rate possible through the air-cooling unit ($V_{c,max}$) 740. Assuming that the required coolant flow rate is less than the maximum possible flow rate, then the control unit sets the coolant pump variable frequency drive or a control valve associated with the coolant flow to obtain the desired coolant flow rate ($V_{c,reqd}$) 742. The parameter $\Delta V$ determined via step 736 or 738 (in FIG. 7B) is used to make this change. Processing subsequently waits a defined time interval $t_2$ before automatically returning to FIG. 7A to repeat the above-noted dynamic control of the airflow rate through and heat removal rate of the air-cooling unit.

If the required coolant flow rate through the air-cooling unit's heat exchanger is not less than the maximum possible coolant flow rate, then processing sets the variable frequency drive of the coolant pump or sets one or more control valves in the coolant flow loop to the highest coolant flow setting 746, and determines a rate of heat removal using this highest coolant flow rate setting 748. An "insufficient cooling capability" warning is then output 750, along with one or more of the current results 752, including one or more of the heat load generated by the electronics rack (q), the heat removal rate of the air-cooling unit ($q_{hex}$), the airflow rate through the electronics rack ($V_a$), the volumetric flow rate of coolant through the air-cooling unit's heat exchanger ($V_c$), the inlet air temperature to the air-cooling unit's heat exchanger ($T_{in,a}$), the outlet air temperature from the air-cooling unit's heat exchanger ($T_{out,a}$), the inlet coolant temperature to the air-cooling unit's heat exchanger ($T_{in,c}$), and the outlet coolant temperature from the air-cooling unit's heat exchanger ($T_{out,c}$). Processing subsequently waits a defined time interval $t_2$ before returning back to determine whether the required coolant flow rate through the air-cooling unit's heat exchanger is less than the maximum possible coolant flow rate through the air-cooling unit's heat exchanger.

TABLE 1

| Variable/ Equation | Definition |
|---|---|
| $T_{in}$ | Inlet air temperature to the associated electronics rack, °C. |
| $T_{out}$ | Outlet air temperature to the associated electronics rack, °C. |
| q | Heat load of the associated electronics rack, W. |
| $V_a$ | Volumetric flow rate of the associated electronics rack, m³/s. |
| $\rho_a$ | Mass density of air, kg/m³. |
| $C_{p,a}$ | Specific heat capacity of air at constant pressure, J/kg-K. |
| $T_{in,a}$ | Inlet air temperature to the heat exchanger, °C. |
| $T_{out,a}$ | Outlet air temperature from the heat exchanger, °C. |
| $T_{in,c}$ | Inlet coolant temperature to the heat exchanger, °C. |
| $T_{out,c}$ | Outlet coolant temperature from the heat exchanger, °C. |
| $q_{hex}$ | Heat removal rate of the air-cooling unit, W. |
| $t_1$ | Time delay, s. |
| $C_c$ | Heat capacity rate of coolant flow rate through the air-cooling unit, W/K. |
| $C_a$ | Heat capacity rate of airflow rate through the air-cooling unit, W/K. |
| $C_{min}$ | Smaller of the two fluid stream heat capacity rates, W/K. |
| $C_{max}$ | Larger of the two fluid stream heat capacity rates, W/K. |
| C | Ratio of $C_{min}$ to $C_{max}$. |
| $V_c$ | Volumetric flow rate of coolant through the air-cooing unit, m³/s. |
| $\rho_c$ | Mass density of coolant, kg/m³. |
| $C_{p,c}$ | Specific heat of coolant at constant pressure, J/kg-K. |
| $\varepsilon_{reqd}$ | Estimated target value of the air-cooling unit effectiveness. |
| $V_{c,reqd}$ | Estimated target value of the air-cooling unit's volumetric coolant flow rate, m³/s. |
| $V_{c,max}$ | Maximum possible volumetric coolant flow rate capacity the air-cooling unit effectiveness, m³/s. |

TABLE 1-continued

| Variable/Equation | Definition |
|---|---|
| $C_{c,reqd}$ | Estimated value of target heat capacity rate of coolant flow rate through the air-cooling unit, W/K. |
| UA | Design value for heat exchanger thermal conductance, W/° C. |
| NTU | Number of transfer units (heat exchanger terminology for relative heat transfer size). |

Figure 8:
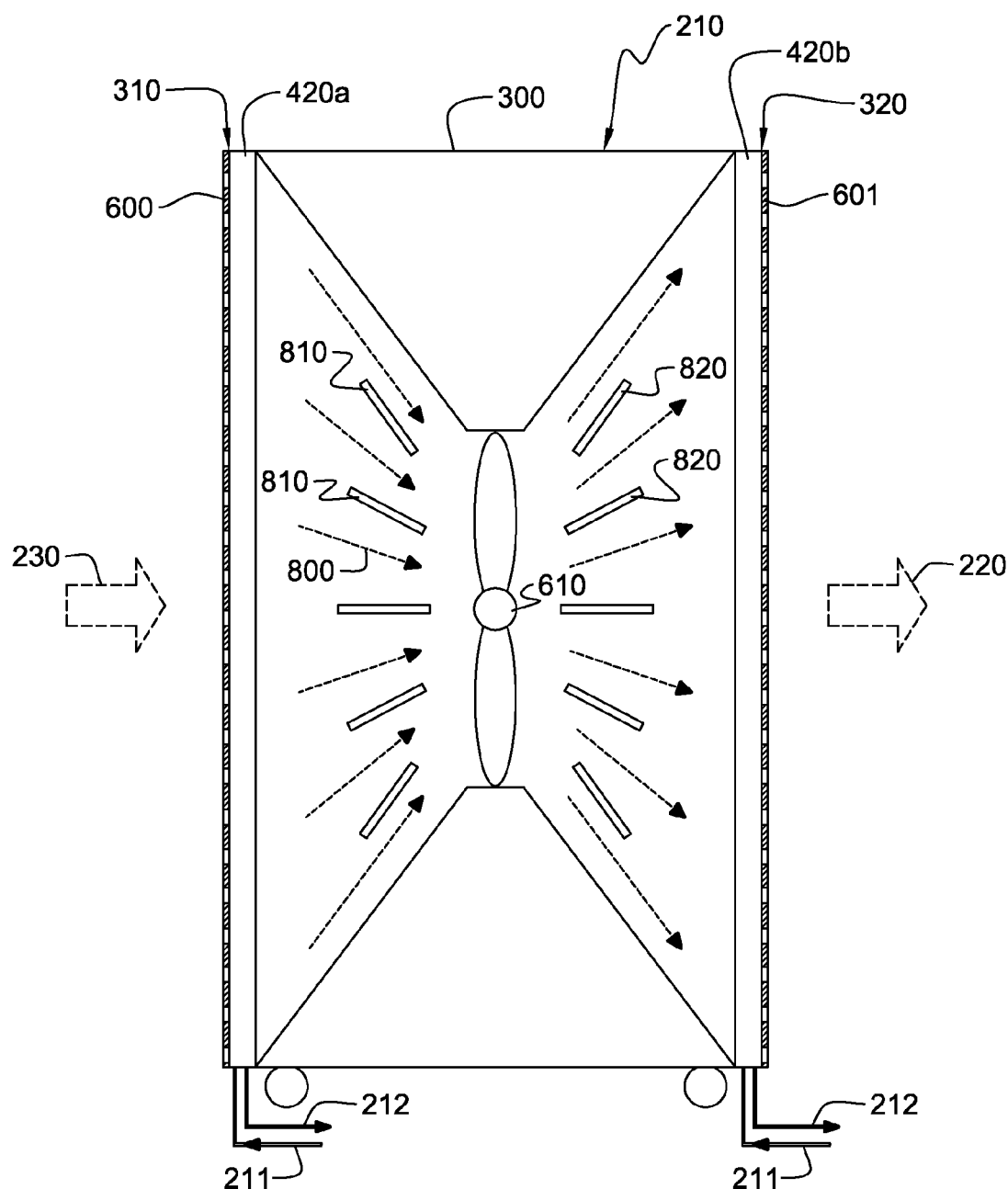
FIG. 8 is a cross-sectional elevational view of an alternate embodiment of an air-cooling unit, in accordance with an aspect of the present invention.
Figure 9:
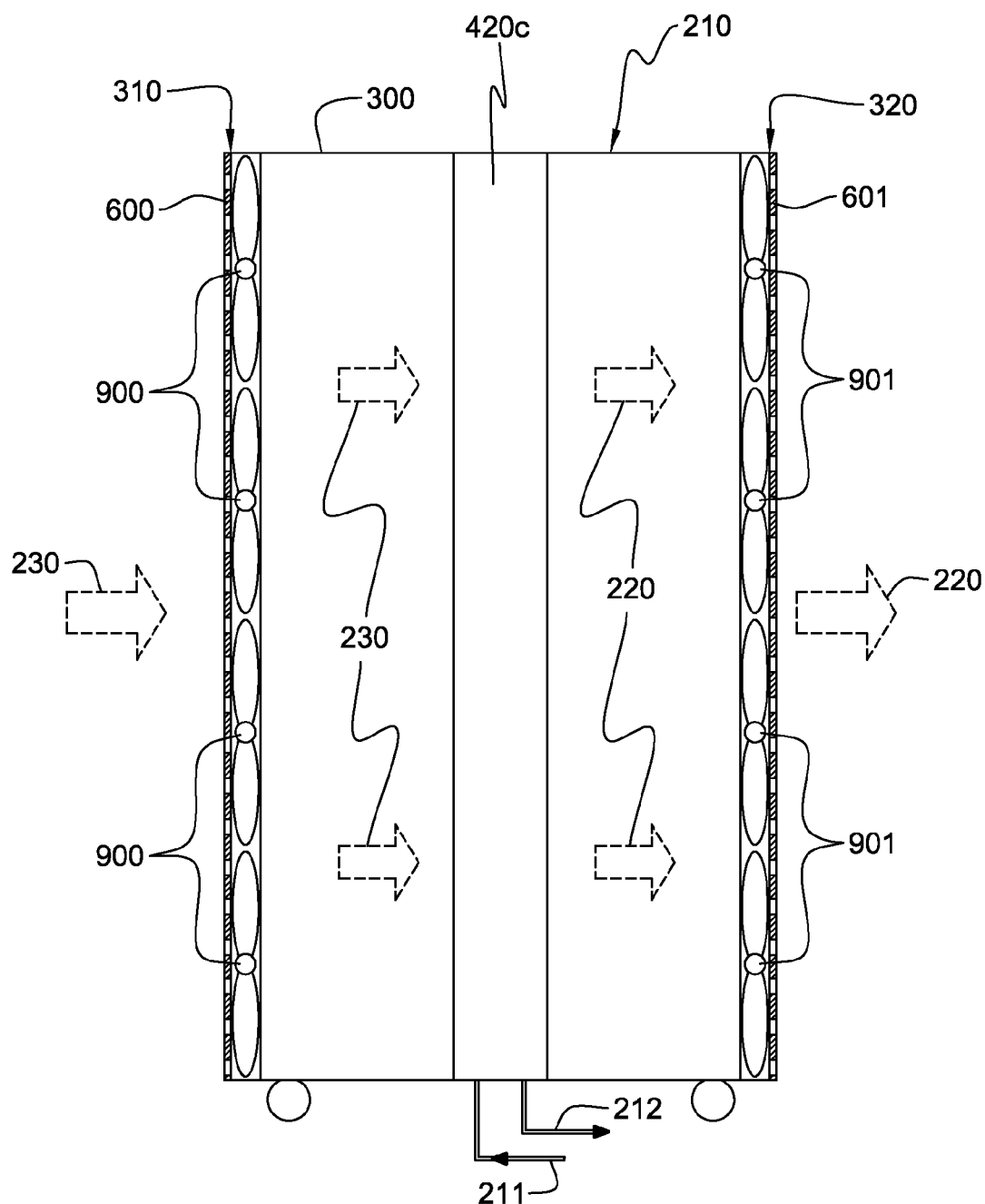
FIG. 9 is a cross-sectional elevational view of an another alternate embodiment of an air-cooling unit, in accordance with an aspect of the present invention.
Figure 10:
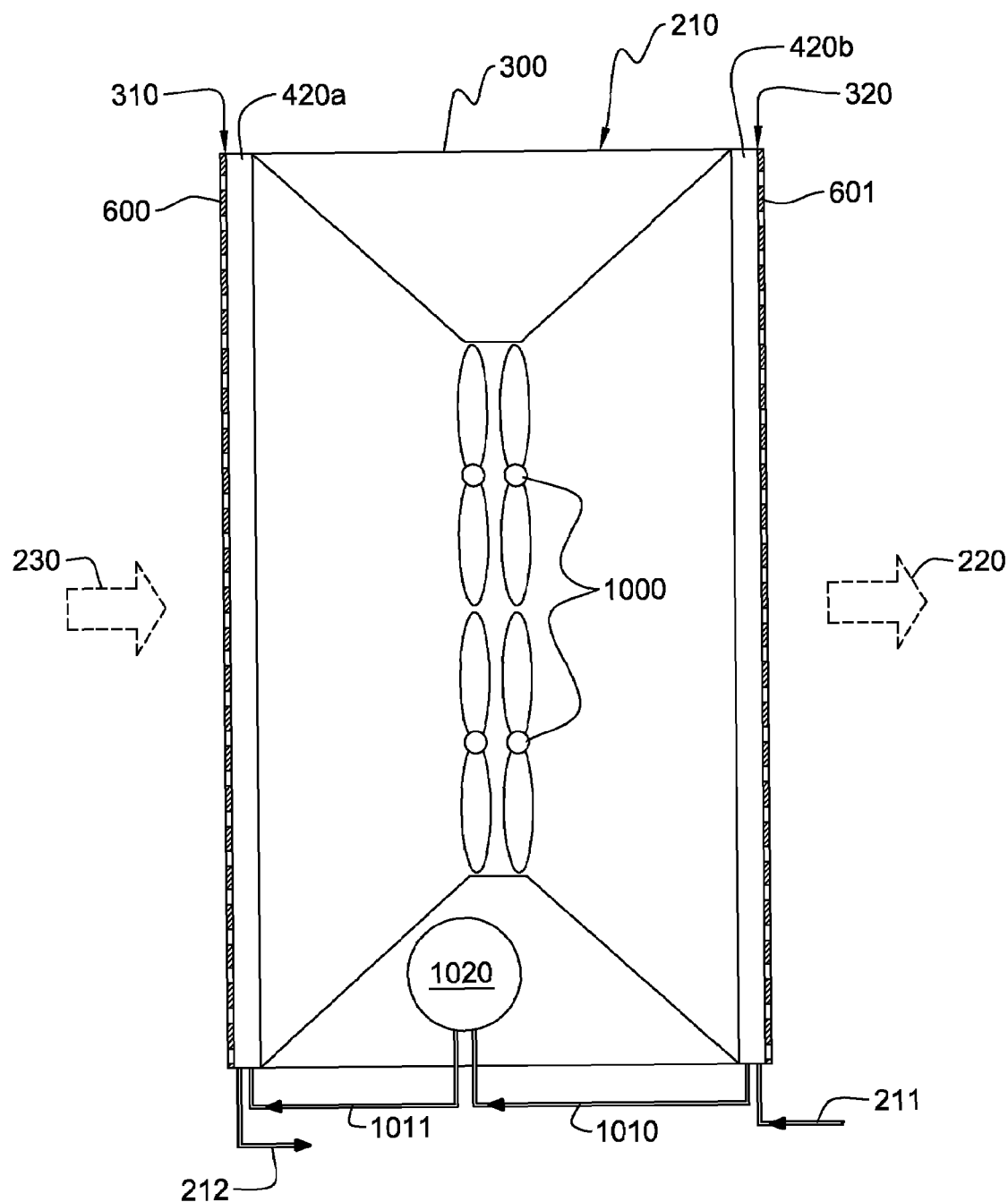
FIG. 10 is a cross-sectional elevational view of a further alternate embodiment of an air-cooling unit, in accordance with an aspect of the present invention.

FIGS. 8-10 depict several alternate embodiments of an air-cooing unit 210, in accordance with an aspect of the present invention. In these alternate embodiments, the control unit, temperature sensors, fluid pump and VFDs of the air-moving devices and the fluid pump are not illustrated, but rather are assumed to be present, as described above in connection with the embodiment of FIGS. 3A-6. These figures depict variations on the heat exchanger configuration and the air-moving device configuration.

In the embodiment of FIG. 8, air-cooling unit 210 includes a housing 300 with an air inlet door 310 and an air outlet door 320. Air inlet door 310 includes a perforated air inlet cover 600 and air outlet door 320 includes a perforated air outlet cover 601, which facilitate the ingress and egress of external air 230, 220, respectively. Air inlet door 310 also includes a first air-to-liquid heat exchanger 420a, and air outlet door 320 includes a second air-to-liquid heat exchanger 420b. Each heat exchanger is coupled to receive coolant via an appropriately manifolded coolant supply line 211 and an appropriately manifolded coolant return line 212. Air is drawn through housing 300 via one or more centrally disposed air-moving devices. In the illustrated embodiment, air-moving device 610 draws hot exhaust air 230 across first air-to-liquid heat exchanger 420a to cool the air 800 to an intermediate temperature. This air 800 of intermediate temperature is then further cooled by second air-to-liquid heat exchanger 420b before being exhausted as the chilled air 220 to be provided to the air inlet side of a downstream electronics racks. Housing 300 is configured with baffles 810, 820 to facilitate the uniform distribution of airflow across the first and second air-to-liquid heat exchangers. In one embodiment, air-cooling unit 210 is similar in dimension to one or more associated electronics racks to be cooled to facilitate the horizontal movement of airflow from one electronics rack into the air-cooling unit and then out to the air inlet of another electronics rack, as noted above in connection with FIG. 2.

In FIG. 9, air-cooling unit 210 includes housing 300 with air inlet door 310 and air outlet door 320 hingedly coupled thereto at the air inlet side and air outlet side thereof. Air inlet door 310 includes a perforated air inlet cover 600 and air outlet door 320 includes a perforated air outlet cover 601, which facilitate the ingress and egress of air 230, 220, respectively, through air-cooling unit 210. In this embodiment, a plurality of air-moving devices 900 are disposed at the air inlet side of housing 300, for example, within air inlet door 310, and a plurality of air-moving devices 901 are disposed at the air outlet side of housing 300, for example, within air outlet door 320.

As noted, the air-cooling embodiments of FIGS. 8-10 further include a control unit, data lines, and the VFD controls illustrated above in connection with the embodiment of FIGS. 3A-6, in addition to a control mechanism for controlling the flow of coolant through the heat exchanger(s) of the air-cooling unit. In the embodiment of FIG. 9, the heat exchanger 420c is a single large, centrally disposed heat exchanger within housing 300. Coolant flow through heat exchanger 420c is again controlled via a coolant pump or one or more control valves (not shown), and is fed from coolant supply line 211 and exhausted via a coolant return line 212. Advantageously, the illustrated embodiment allows for a significantly larger heat exchanger to be employed within the air-cooling unit than may be possible with the disposition of the heat exchanger within the air inlet door or air outlet door of the air-cooling unit.

In the embodiment of FIG. 10, the air-cooling unit 210 includes a housing 300 with an air inlet door 310 and air outlet door 320 hingedly coupled thereto. Perforated air inlet cover 600 and perforated air outlet cover 601 facilitate the ingress and egress of external air 230, 220, respectively through the air-cooling unit. In this embodiment, multiple centrally disposed air-moving devices 1000 are provided to move air through the air-cooling unit.

Although not shown, a control unit similar to that depicted above in connection with the embodiment of FIGS. 3A-6 and one or more variable frequency drive units are electronically coupled to air-moving devices 1000 for dynamically, automatically controlling the airflow rate through the air-cooling unit. Note that with respect to this embodiment, the air-moving devices 1000 may be provided either in-series or in parallel, with or without redundancy.

In the embodiment of FIG. 10, a first air-to-liquid heat exchanger 420a is disposed within air inlet door 310, and a second air-to-liquid heat exchanger 420b is disposed within air outlet door 320. These heat exchangers may comprise heat exchangers similar to that described above in connection with the embodiment of FIGS. 3A-6. As illustrated, heat exchangers 420a and 420b are serially coupled in fluid communication so that coolant exiting second air-to-liquid heat exchanger 420b is pumped via supply line 1010, coolant pump 1020, and supply line 1011 into the coolant inlet of first air-to-liquid heat exchanger 420a, before being exhausted via coolant return line 212.

The control unit (not shown) for this embodiment would employ temperature sensors on both sides of each heat exchanger. Thus, temperature sensors at the air inlet to first air-to-liquid heat exchanger 420a, temperature sensors between the air outlet of first air-to-liquid heat exchanger 420a and air inlet of second air-to-liquid heat exchanger 420b, and temperature sensors at the air outlet of second air-to-liquid heat exchanger 420b would be employed. Variable frequency drives coupled to the air-moving devices and to the fluid pump allow the control unit to dynamically, automatically control the airflow rate through and heat removal rate of the air-cooling unit.

Figure 11:
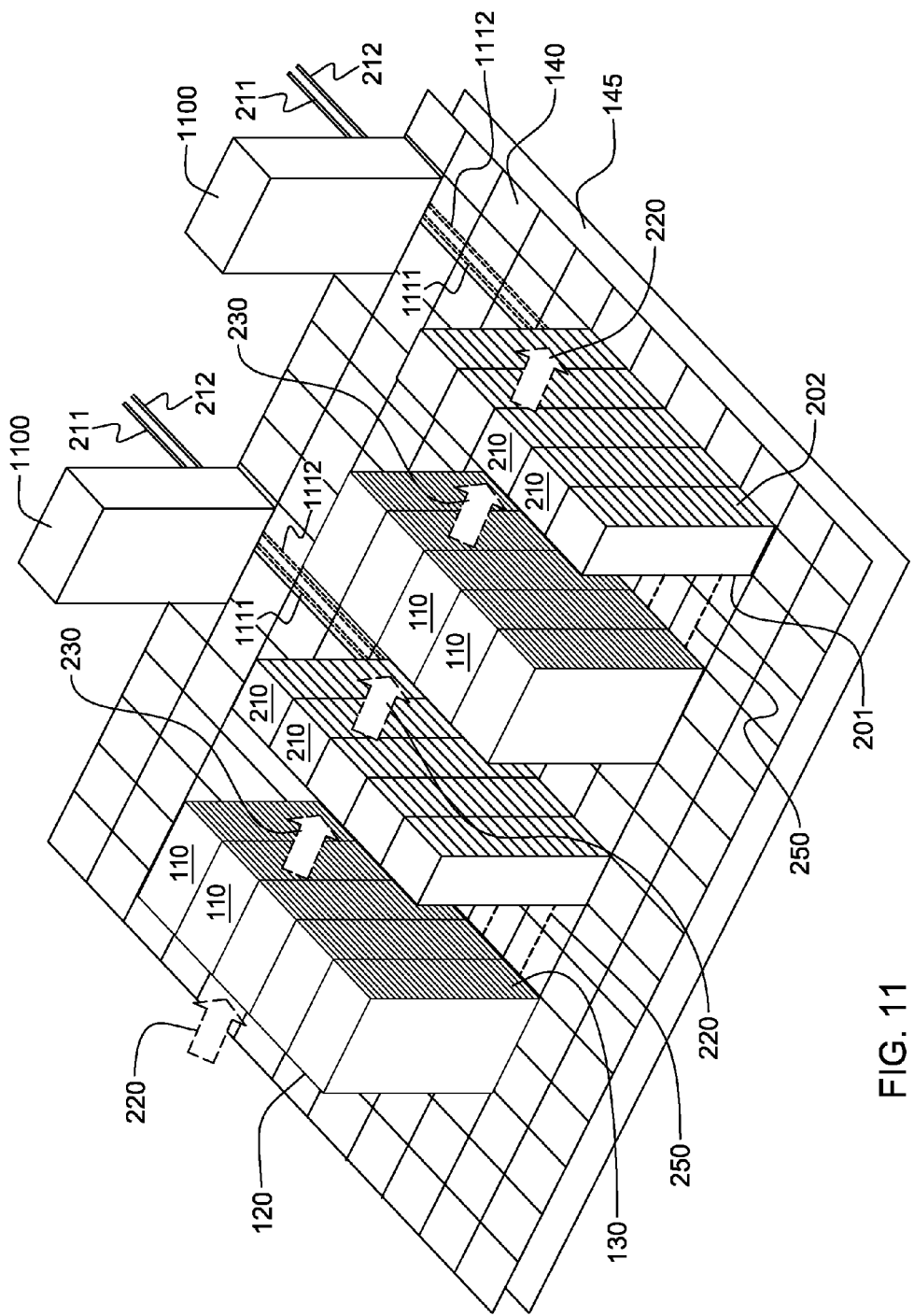
FIG. 11 depicts an alternate data center layout comprising a plurality of electronics racks and a plurality of air-cooling units (receiving liquid coolant from one or more coolant distribution units), in accordance with an aspect of the present invention.
Figure 12:
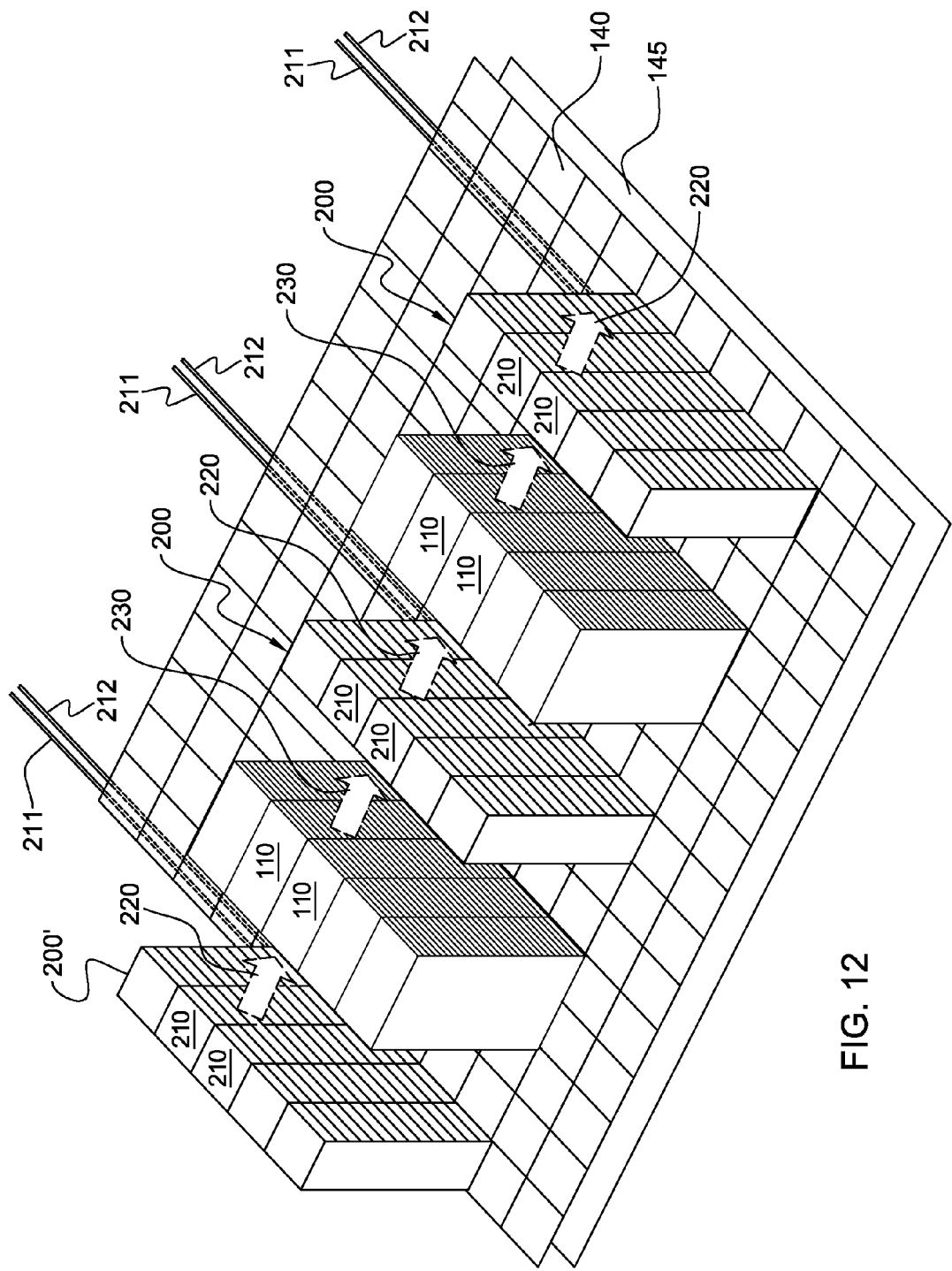
FIG. 12 depicts a further alternate data center layout, wherein x+1 rows of air-cooling units cool x rows of electronics racks, in accordance with an aspect of the present invention.
Figure 13:
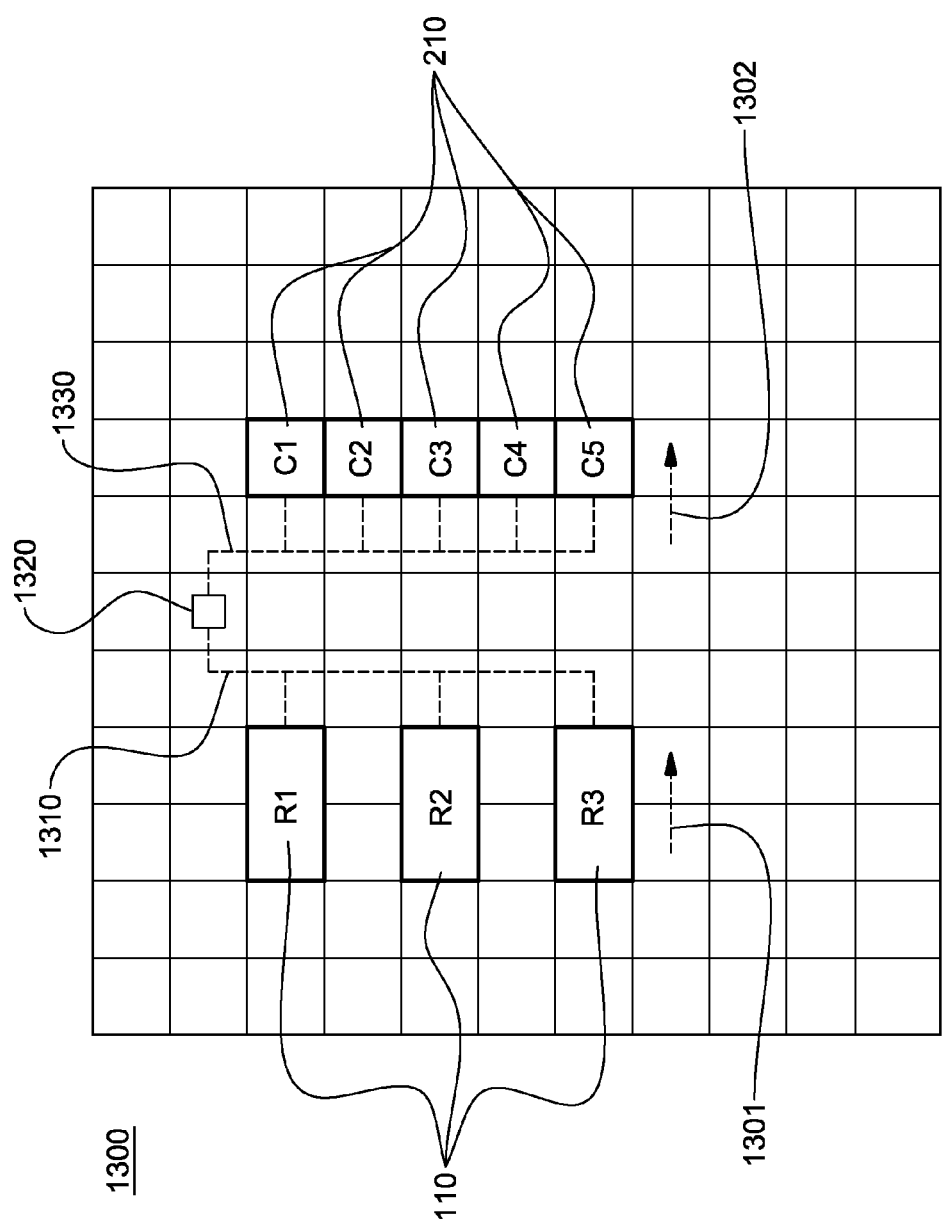
FIG. 13 is a schematic layout of n electronics racks of a data center being cooled by m air-cooling units, wherein n≠m, in accordance with an aspect of the present invention.

FIGS. 11-13 depict several alternate data center layout configurations, in accordance with aspects of the present invention.

The data center layout of FIG. 11 is substantially identical to the data center layout of FIG. 2, with the exception of the addition of multiple coolant distribution units 1100 interposed between the coolant supply and return lines 211, 212 and the air-cooling units 210. As illustrated, multiple rows of air-cooling units 210 are provided at the air outlet sides 130 of multiple rows of electronics racks 110. In this embodiment, air-cooling units 210 supply 100% of the chilled air 220 to the air inlet sides 120 of electronics rack 110 by cooling the hot exhaust air 230 from the air outlet sides 130 of the racks. Each air-cooling unit includes at least one air-to-liquid heat exchanger which exhausts heat from hot exhaust air 230 to coolant flowing through the heat exchanger(s) via respective system coolant supply lines 1111 and system coolant return lines 1112 coupling air-cooling units 210 with the respective coolant distribution unit 1100. Each coolant distribution unit 1100, which buffers the system coolant flowing to the air-cooling units from the facility side coolant supply line 211 and coolant return line 212, includes one or more liquid-to-liquid heat exchangers which facilitate the transfer of heat from the air-cooling units 210 (via system coolant flowing through system coolant supply and return lines 1111, 1112) to facility coolant flowing through coolant supply and return lines 211, 212. In the raised floor embodiment depicted in FIG. 11, the system coolant supply lines 1111 and system coolant return lines 1112 reside beneath raised floor 140 in the under-floor plenum space 145.

As in the data center embodiment of FIG. 2, each air-cooling unit 210 includes an air inlet side 201 and an air outlet side 202. The air inlet sides 201 of air-cooling units 210 are disposed in spaced, opposing relation to the air outlet sides 130 of electronics racks 110. As one detailed example, air-cooling units 210 may be spaced three feet or less from the air outlet sides of the electronics racks to facilitate drawing of exhausted hot air 230 into the air-cooling units 210. In the embodiment illustrated in FIG. 11, there is assumed to be a 1:1 correlation between electronics racks 110 and air-cooling units 210. This is provided by way of example only. In this implementation, each air-cooling unit 210 automatically adjusts its airflow rate through and heat removal rate to dynamically relate to the airflow rate through and heat removal rate of the respective electronics rack. Data cables 250 are provided, coupling each electronics rack 110 to the control unit of its respective air-cooling unit 210, for use providing electronics rack data which facilitates the automatic setting of airflow rate through the air-cooling unit and heat removal rate of the air-cooling unit, as explained above.

FIG. 12 depicts a similar configuration to the data center layout of FIG. 2, with the exception of the addition of another row 200' of air-cooling units 210. This additional row of air-cooling units results in x+1 rows of air-cooling units for the x rows of electronics racks to be cooled, and facilitates the provision of chilled air 220 to the air inlet sides of the left-most row of electronics racks 110 within the data center layout. Each row of air-cooling units 200, 200' is again fed with liquid coolant via coolant supply and return lines 211, 212, which in one example may comprise a facility coolant supply and return lines. These supply and return lines may reside in the under-floor plenum space 145 defined between raised floor 140 and a base sub-floor of the data center. As illustrated, each air-cooling unit 210 is sized and configured so that chilled air 220 exhausting therefrom is directed towards and substantially, three-dimensionally covers the air inlet side of an electronics rack 110 to be cooled. Similarly, the air-cooling units 210 are positioned at the air outlet sides of one or more electronics racks so that hot exhaust air 230 therefrom flows directly horizontally into the air-cooling units 210.

FIG. 13 is a schematic of a further embodiment of a data center layout, in accordance with an aspect of the present invention. In this embodiment, data center layout 1300 includes a row of a plurality of electronics racks 110, labeled R1, R2 & R3. As illustrated, electronics racks 110 are spaced apart from each other and are spaced from a row of air-cooling units 210 labeled C1, C2, C3, C4 & C5. Air flows through electronics racks 110 in airflow direction 1301 and air flows through air-cooling units 210 is in the airflow direction 1302. A centralized control unit 1320 is coupled via data cables 1310 to electronics racks 110, and via data cables 1330 to air-cooling units 210. These data cables provide flow and power data to the central control unit 1320. In operation, central control unit 1320 may total the heat load and airflow rate from the electronics racks and divide the totals to obtain a prorated airflow rate and heat removal rate target for each air-cooling unit. Additionally, if desired, weighting factors could be employed by the control unit in setting the targets, for example, based on flow profiles exiting the electronics racks.

Those skilled in the art will note from the above description that provided herein are a novel control method and air-cooling unit which provide numerous advantages over the traditional air-cooling approach of a raised floor data center. These advantages include:

- A substantially lower total airflow rate required due to the elimination of leakage flows (e.g., a 30%-50% reduction).
- Significantly lower pressure rise required by the air-moving devices in the air-cooling units (e.g., by a factor of 5-7).
- Significant reduction in pumping power used to move air (by a factor of approximately 7).
- Significantly higher chilled coolant set point temperature required to perform comparable cooling (e.g., approximately 7-10° C. higher).
- Significant energy savings at the refrigeration plant (e.g., approximately 18% for 10° C. rise) for the reason noted above, potentially resulting in a reduction in refrigerant plant size.
- A lowered required coolant flow rate to the air-cooling units (e.g., approximately 33% less), leading to a much lower required coolant pumping power (e.g., approximately 50%).
- A lower total cost of ownership for the above-noted reasons.
- A several orders of magnitude reduction in acoustic noise due to a much lower pressure drop (e.g., by a factor of 5-6). Wherein acoustic noise is roughly proportional to the fifth power of pressure drop.
- A lower data center footprint for comparable cooling capability (e.g., an approximately 40% reduction in footprint size compared with a traditional raised floor computer room air-conditioning implementation).

Additional advantages of the concepts presented herein include: the potential elimination of condensation at the heat exchanger, so that no insulation may be required for plumbing; the provision of flexibility in implementing the cooling approach due to the modular nature of the horizontal cooling units; and the provision of cooling as needed, with customization readily possible for a particular heat-generating cluster.

The detailed description presented above is discussed in terms of procedures which can be executed on a computer, a network or a cluster of computers. These procedural descriptions and representations are used by those skilled in the art to most effectively convey the substance of their work to others skilled in the art. They may be implemented in hardware or software, or a combination of the two.

A procedure is here, and generally, conceived to be a sequence of steps leading to a desired result. These steps are those requiring physical manipulations of physical quantities. Usually, though not necessarily, these quantities take the form of electrical or magnetic signals capable of being stored, transferred, combined, compared, and otherwise manipulated. It proves convenient at times, principally for reasons of common usage, to refer to these signals as bits, values, elements, symbols, characters, terms, numbers, objects, attributes or the like. It should be noted, however, that all of these and similar terms are to be associated with the appropriate physical quantities and are merely convenient labels applied to these quantities.

Further, the manipulations performed are often referred to in terms, such as closing or opening, which are commonly associated with manual operations performed by a human operator. No such intervention of a human operator is necessary in the operations described herein which form part of the present invention; the operations may be implemented as automatic machine operations. Useful machines for performing the operations of the present invention include general purpose digital computers or similar devices.

Aspects of the invention are preferably implemented in a high level procedural or object-oriented programming language to communicate with a computer. However, the inventive aspects can be implemented in assembly or machine language, if desired. In any case, the language may be a compiled or interpreted language.

The invention may be implemented as a mechanism or a computer program product comprising a recording medium. Such a mechanism or computer program product may include, but is not limited to CD-ROMs, diskettes, tapes, hard drives, computer RAM or ROM and/or the electronic, magnetic, optical, biological or other similar embodiment of the program. Indeed, the mechanism or computer program product may include any solid or fluid transmission medium, magnetic or optical, or the like, for storing or transmitting signals readable by a machine for controlling the operation of a general or special purpose programmable computer according to the method of the invention and/or to structure its components in accordance with a system of the invention.

Aspects of the invention may be implemented in a system. A system may comprise a computer that includes a processor and a memory device and optionally, a storage device, an output device such as a video display and/or an input device such as a keyboard or computer mouse. Moreover, a system may comprise an interconnected network of computers. Computers may equally be in stand-alone form (such as the traditional desktop personal computer) or integrated into another environment (such as a partially clustered computing environment). The system may be specially constructed for the required purposes to perform, for example, the method steps of the invention or it may comprise one or more general purpose computers as selectively activated or reconfigured by a computer program in accordance with the teachings herein stored in the computer(s). The procedures presented herein are not inherently related to a particular computing environment. The required structure for a variety of these systems will appear from the description given.

The capabilities of one or more aspects of the present invention can be implemented in software, firmware, hardware or some combination thereof.

One or more aspects of the present invention can be included in an article of manufacture (e.g., one or more computer program products) having, for instance, computer usable media. The media has therein, for instance, computer readable program code means or logic (e.g., instructions, code, commands, etc.) to provide and facilitate the capabilities of the present invention. The article of manufacture can be included as a part of a computer system or sold separately.

Additionally, at least one program storage device readable by a machine embodying at least one program of instructions executable by the machine to perform the capabilities of the present invention can be provided.

The flow diagrams depicted herein are just examples. There may be many variations to these diagrams or the steps (or operations) described therein without departing from the spirit of the invention. For instance, the steps may be performed in a differing order, or steps may be added, deleted or modified. All of these variations are considered a part of the claimed invention.

Although preferred embodiments have been depicted and described in detail herein, it will be apparent to those skilled in the relevant art that various modifications, additions, substitutions and the like can be made without departing from the spirit of the invention and these are therefore considered to be within the scope of the invention as defined in the following claims.

What is claimed is:

1. A method of facilitating cooling of n electronics racks of a data center employing m air-cooling units within the data center, wherein $n \geq 1$ and $m \geq 1$, the method comprising:
   determining airflow rate through and heat load rate of the n electronics racks;
   setting airflow rate through the m air-cooling units based on the determined airflow rate through the n electronics racks;
   determining heat removal rate of the m air-cooling units; and
   dynamically determining whether a difference between the heat removal rate of the m air-cooling units and the heat load rate of the n electronics racks is within a defined tolerance, and if not, automatically adjusting heat removal rate of the m air-cooling units to bring the difference within the defined tolerance, thereby facilitating cooling of the n electronics racks of the data center.

2. The method of claim 1, wherein the automatically adjusting further comprises automatically determining a required liquid flow rate through at least one air-to-liquid heat exchanger of the m air-cooling units required to bring the difference within the defined tolerance, and adjusting liquid flow rate through the at least one air-to-liquid heat exchanger based on the determined, required liquid flow rate through the at least one air-to-liquid heat exchanger.

3. The method of claim 2, further comprising automatically outputting an insufficient cooling capability warning when liquid flow rate through the at least one air-to-liquid heat exchanger of the m air-cooling units is at a maximum and heat removal rate of the m air-cooling units is insufficient to establish the normalized difference between the heat removal rate of the m air-cooling units and heat load of the n electronics racks within the defined tolerance.

4. The method of claim 1, wherein n is a different number than m, and wherein the method further comprises automatically sensing inlet air temperature to at least one air-to-liquid heat exchanger of the m air-cooling units and employing the air inlet temperature to the at least one air-to-liquid heat exchanger in determining heat load rate of at least one electronics rack of the n electronics racks, and employing the heat load rate of the at least one electronics rack in automatically adjusting heat removal rate of at least one air-cooling unit of the m air-cooling units.

5. The method of claim 1, wherein n equals m, and wherein the method is implemented by each air-cooling unit, the method comprising for each air-cooling unit:
   determining airflow rate through and heat load rate of a respective electronics rack of the n electronics racks;
   setting airflow rate through the air-cooling unit based on the determined airflow rate through the respective electronics rack;
   determining heat removal rate of the air-cooling unit; and
   dynamically determining whether a difference between the heat removal rate of the air-cooling unit and the heat load rate of the respective electronics rack is within a defined tolerance, and if not, automatically adjusting heat removal rate of the air-cooling unit to bring the difference within the defined tolerance, thereby facilitating cooling of the n electronics racks of the data center.

6. The method of claim 5, further comprising setting the airflow rate through each air-cooling unit equal to the determined airflow rate through the respective electronics rack, and wherein the automatically adjusting further comprises automatically adjusting liquid coolant flow rate through an air-to-liquid heat exchanger of the air-cooling unit, and wherein the automatically adjusting further comprises automatically determining a required liquid flow rate through the air-to-liquid heat exchanger to bring the difference within the defined tolerance, and adjusting liquid flow rate through the air-to-liquid heat exchanger based on the determined, required liquid flow rate.

7. The method of claim 6, wherein the automatically determining the required liquid flow rate initially includes determining whether heat capacity rate of air passing across the air-to-liquid heat exchanger is lower than heat capacity rate of liquid passing through the air-to-liquid heat exchanger.

8. The method of claim 1, further comprising automatically periodically outputting the determined airflow rate through and heat load rate of the n electronics racks, and the airflow rate through and heat removal rate of the m air-cooling units.

9. An air-cooling unit for a data center, the air-cooling unit comprising:
a housing having an air inlet side and an air outlet side;
an air-moving device for moving air through the housing from the air inlet side to the air outlet side thereof;
an air-to-liquid heat exchanger associated with the housing for cooling air passing through the housing from the air inlet side to the air outlet side thereof; and
a control unit adapted to dynamically control the air-moving device and flow of liquid coolant through the air-to-liquid heat exchanger to automatically adjust airflow rate and heat removal rate of the air-cooling unit to achieve a current airflow rate target and a current heat removal rate target therefore, the current airflow rate target and current heat removal rate target being based on airflow through and heat load generated by at least one associated electronics racks of the data center.

10. The air-cooling unit of claim 9, further comprising at least one air inlet temperature sensor for sensing inlet temperature of air passing across the air-to-liquid heat exchanger ($T_{in,a}$), at least one air outlet temperature sensor for sensing outlet temperature of air passing across the air-to-liquid heat exchanger ($T_{out,a}$), a coolant inlet temperature sensor for sensing coolant inlet temperature to the air-to-liquid heat exchanger ($T_{in,c}$), and a coolant outlet temperature sensor for sensing coolant outlet temperature from the air-to-liquid heat exchanger ($T_{out,c}$) and wherein the control unit automatically determines heat removal rate of the air-cooling unit employing airflow rate through the air-cooling unit, and the sensed temperatures $T_{in,a}$, $T_{out,a}$, $T_{in,c}$, and $T_{out,c}$.

11. The air-cooling unit of claim 9, further comprising an adjustable coolant pump for pumping coolant through the air-to-liquid heat exchanger, and wherein the control unit is electronically coupled to the air-moving device and to the adjustable coolant pump for automatically adjusting airflow rate through and heat removal rate of the air-cooling unit, and wherein the control unit automatically determines the current airflow rate target and the current heat removal rate target based on a current airflow rate through and a current heat load generated by the at least one associated electronics rack of the data center.

12. The air-cooling unit of claim 9, wherein the air-to-liquid heat exchanger is a first air-to-liquid heat exchanger, and wherein the air-cooling unit further comprises a second air-to-liquid heat exchanger, the first air-to-liquid heat exchanger being disposed at the air inlet side of the air-cooling unit and the second air-to-liquid heat exchanger being disposed at the air outlet side of the air-cooling unit, and wherein the control unit automatically controls flow of coolant through both the first air-to-liquid heat exchanger and the second air-to-liquid heat exchanger.

13. The air-cooling unit of claim 12, further comprising a plurality of air-moving devices, the plurality of air-moving devices being centrally disposed within the housing for moving air through the housing from the air inlet side to the air outlet side thereof.

14. The air-cooling unit of claim 13, wherein the first air-to-liquid heat exchanger is disposed within an inlet door hingedly coupled to the housing, and wherein the second air-to-liquid heat exchanger is disposed with an outlet door hingedly coupled to the housing.

15. The air-cooling unit of claim 9, further comprising a plurality of air-moving devices for moving air through the housing from the air inlet side to the air outlet side thereof, the plurality of air-moving devices being disposed adjacent to at least one of the air inlet side or the air outlet side of the housing.

16. The air-cooling unit of claim 9, wherein the air-cooling unit is separate from the at least one associated electronics rack and is configured for disposition at the air outlet side of the at least one associated electronics rack of the data center.

17. A data center comprising:
n electronics racks, wherein n≧1, each electronics rack comprising an air inlet side and an air outlet side, the air inlet and air outlet sides respectively enabling ingress and egress of air through the electronics rack;
m air-cooling units, wherein m≧1, and each air-cooling unit comprises:
a housing having an air inlet side and an air outlet side;
an air-moving device for moving air through the housing from the air inlet side to the air outlet side thereof;
an air-to-liquid heat exchanger associated with the housing for cooling air passing through the housing from the air inlet side to the air outlet side thereof; and
at least one control unit adapted to dynamically control the air-moving device and flow of liquid coolant through the air-to-liquid heat exchanger of each air-cooling unit of the m air-cooling units to automatically adjust airflow rate through and heat removal rate of the m air-cooling units to achieve a current airflow rate target and a current heat removal rate target therefore, the current airflow rate target and current heat removal rate target being based on a current airflow rate through and a current heat load generated by the n electronics racks of the data center.

18. The data center of claim 17, wherein the n electronics racks are aligned in at least one row and the m air-cooling units are aligned in at least one row disposed on the air outlet sides of the n electronics racks.

19. The data center of claim 17, wherein each air-cooling unit further comprises an adjustable coolant pump for pumping coolant through the air-to-liquid heat exchanger thereof, and wherein the at least one control unit is electronically coupled to the air-moving device and to the adjustable coolant pump of each air-cooling unit for automatically adjusting airflow rate through and heat removal rate of the air-cooling unit, and wherein the at least one control unit automatically, dynamically determines the current airflow rate target and the current heat removal rate target based on a current airflow rate through and a current heat load generated by the n electronics racks of the data center.

20. The data center of claim 17, wherein the at least one control unit automatically, dynamically determines the current airflow rate target and the current heat removal rate target for each air-cooling unit employing, in part, a current airflow rate through and a current heat load rate of the n electronics racks of the data center, and wherein airflow through the m air-cooling units is adjusted to be substantially equal to airflow rate through the n electronics racks.

* * * * *